United States Patent
Hill et al.

(10) Patent No.: US 8,477,499 B2
(45) Date of Patent: Jul. 2, 2013

(54) ASSEMBLIES AND METHODS FOR DISSIPATING HEAT FROM HANDHELD ELECTRONIC DEVICES

(75) Inventors: Richard F. Hill, Parkman, OH (US); Shahi Riaz, Cleveland, OH (US)

(73) Assignee: Laird Technologies, Inc., Earth City, MO (US)

(*) Notice: Subject to any disclaimer, the term of this patent is extended or adjusted under 35 U.S.C. 154(b) by 266 days.

(21) Appl. No.: 13/164,653

(22) Filed: Jun. 20, 2011

(65) Prior Publication Data

US 2011/0242764 A1    Oct. 6, 2011

Related U.S. Application Data

(63) Continuation-in-part of application No. 12/479,284, filed on Jun. 5, 2009, now Pat. No. 7,965,514.

(51) Int. Cl.
    *H05K 7/20* (2006.01)
(52) U.S. Cl.
    USPC .......... 361/707; 361/704; 361/714; 361/719; 361/816; 361/818
(58) Field of Classification Search
    None
    See application file for complete search history.

(56) References Cited

U.S. PATENT DOCUMENTS

| | | |
|---|---|---|
| 3,047,648 A | 7/1962 | Mowatt |
| 3,208,511 A | 9/1965 | McAdam |
| 3,572,428 A | 3/1971 | Monaco |
| 3,721,746 A | 3/1973 | Knappenberger |
| 4,203,488 A | 5/1980 | Johnson et al. |
| 4,235,285 A | 11/1980 | Johnson et al. |
| 4,345,267 A | 8/1982 | Corman et al. |
| 4,405,961 A | 9/1983 | Chow et al. |
| 4,433,886 A | 2/1984 | Cassarly et al. |
| 4,481,525 A | 11/1984 | Calabro et al. |
| 4,508,163 A | 4/1985 | McCarthy |

(Continued)

FOREIGN PATENT DOCUMENTS

| | | |
|---|---|---|
| EP | 0632686 | 8/1996 |
| EP | 0910005 | 4/1999 |
| EP | 1364565 | 6/2002 |
| EP | 1267250 | 12/2002 |

(Continued)

OTHER PUBLICATIONS

European Search Report for EP Application No. EP10164591.9 (now published as EP2262354) which also lists Richard F. Hill and Shahi Riaz as inventors, and includes a priority claim to U.S. Appl. No. 12/479,284, now U.S. Patent 7,965,514. U.S. Appl. No. 12/479,284 is the parent application for the instant application; dated Sep. 2, 2010; 3 pages.

(Continued)

*Primary Examiner* — Boris Chervinsky
(74) *Attorney, Agent, or Firm* — Harness, Dickey & Pierce, P.L.C.

(57) ABSTRACT

According to various aspects of the present disclosure, exemplary embodiments include assemblies and methods for dissipating heat from an electronic device by a thermally-conducting heat path to the external casing via one or more portions of an electromagnetic interference shield and/or thermal interface material disposed around the device's battery or other power source. In an exemplary embodiment, a thermally conductive structure which comprises elastomer may be disposed about or define a battery area such that heat may be transferred to the external casing by a thermally-conductive heat path around the battery area through or along the thermally conductive structure which comprises elastomer.

24 Claims, 15 Drawing Sheets

U.S. PATENT DOCUMENTS

| | | | |
|---|---|---|---|
| 4,648,125 A | 3/1987 | Brown | |
| 4,661,888 A | 4/1987 | Jewell et al. | |
| 4,679,118 A | 7/1987 | Johnson et al. | |
| 4,729,426 A | 3/1988 | Hinshaw | |
| 4,736,277 A | 4/1988 | Brown | |
| 4,754,101 A | 6/1988 | Stickney et al. | |
| 4,791,527 A | 12/1988 | Brown | |
| 4,794,489 A | 12/1988 | Brown | |
| 4,933,746 A | 6/1990 | King | |
| 5,052,481 A | 10/1991 | Horvath et al. | |
| 5,060,114 A * | 10/1991 | Feinberg et al. | 361/706 |
| 5,130,888 A | 7/1992 | Moore | |
| 5,175,395 A | 12/1992 | Moore | |
| 5,175,613 A | 12/1992 | Barker, III et al. | |
| 5,208,731 A | 5/1993 | Blomquist | |
| 5,241,453 A | 8/1993 | Bright et al. | |
| 5,285,350 A | 2/1994 | Villaume | |
| 5,287,001 A | 2/1994 | Buchmann et al. | |
| 5,288,313 A | 2/1994 | Portner | |
| 5,295,043 A | 3/1994 | Beijer | |
| 5,329,426 A | 7/1994 | Villani | |
| 5,354,951 A | 10/1994 | Lange, Sr. et al. | |
| 5,357,404 A | 10/1994 | Bright et al. | |
| 5,365,399 A | 11/1994 | Kent et al. | |
| 5,367,433 A | 11/1994 | Blomquist | |
| 5,416,668 A | 5/1995 | Benzoni | |
| 5,461,257 A | 10/1995 | Hundt | |
| 5,485,037 A | 1/1996 | Marrs | |
| 5,524,908 A | 6/1996 | Reis | |
| 5,541,811 A | 7/1996 | Henningsson et al. | |
| 5,550,713 A | 8/1996 | Pressler et al. | |
| 5,552,635 A | 9/1996 | Kim et al. | |
| 5,566,052 A | 10/1996 | Hughes | |
| 5,585,671 A | 12/1996 | Nagesh et al. | |
| 5,586,005 A | 12/1996 | Cipolla et al. | |
| 5,640,047 A | 6/1997 | Nakashima | |
| 5,663,786 A | 9/1997 | Miyamori | |
| 5,706,579 A | 1/1998 | Ross | |
| 5,717,248 A | 2/1998 | Neumann et al. | |
| 5,717,577 A | 2/1998 | Mendolia et al. | |
| 5,763,824 A | 6/1998 | King et al. | |
| 5,804,875 A | 9/1998 | Remsburg et al. | |
| 5,811,050 A | 9/1998 | Gabower | |
| 5,866,943 A | 2/1999 | Mertol | |
| 5,893,409 A | 4/1999 | Kohler et al. | |
| 5,917,701 A | 6/1999 | Solberg | |
| 5,990,418 A | 11/1999 | Bivona et al. | |
| 6,005,186 A | 12/1999 | Bachman | |
| 6,025,991 A | 2/2000 | Saito | |
| 6,049,469 A | 4/2000 | Hood, III et al. | |
| 6,075,700 A | 6/2000 | Houghton et al. | |
| 6,122,167 A | 9/2000 | Smith et al. | |
| 6,166,918 A | 12/2000 | Olofsson et al. | |
| 6,178,097 B1 | 1/2001 | Hauk, Jr. | |
| 6,178,318 B1 | 1/2001 | Holmberg et al. | |
| 6,181,573 B1 | 1/2001 | Riet | |
| 6,195,267 B1 | 2/2001 | MacDonald, Jr. et al. | |
| 6,205,026 B1 | 3/2001 | Wong et al. | |
| 6,208,515 B1 | 3/2001 | Klein | |
| 6,212,073 B1 | 4/2001 | Yamaguchi | |
| 6,269,008 B1 | 7/2001 | Hsu | |
| 6,347,035 B1 | 2/2002 | Hamano et al. | |
| 6,377,472 B1 | 4/2002 | Fan | |
| 6,377,475 B1 | 4/2002 | Reis | |
| 6,388,189 B1 | 5/2002 | Onoue | |
| 6,410,846 B1 | 6/2002 | Benn, Jr. | |
| 6,426,881 B1 * | 7/2002 | Kurz | 361/800 |
| 6,430,043 B1 | 8/2002 | Osburn | |
| 6,445,583 B1 | 9/2002 | Kline et al. | |
| 6,482,520 B1 | 11/2002 | Tzeng | |
| 6,490,173 B2 | 12/2002 | Perkins et al. | |
| 6,501,018 B2 | 12/2002 | Mayer | |
| 6,503,626 B1 | 1/2003 | Norley et al. | |
| 6,504,095 B1 | 1/2003 | Hoffstrom | |
| 6,552,261 B2 | 4/2003 | Shlahtichman et al. | |
| 6,590,783 B2 | 7/2003 | Spratte et al. | |
| 6,624,432 B1 | 9/2003 | Gabower et al. | |
| 6,673,998 B1 | 1/2004 | Wu | |
| 6,674,653 B1 | 1/2004 | Valentine | |
| 6,676,137 B2 | 1/2004 | Dean | |
| 6,717,799 B2 | 4/2004 | Hamano et al. | |
| 6,744,640 B2 | 6/2004 | Reis et al. | |
| 6,841,250 B2 | 1/2005 | Tzeng | |
| 6,943,287 B2 | 9/2005 | Lloyd et al. | |
| 6,946,598 B1 | 9/2005 | Konshak | |
| 6,965,071 B2 | 11/2005 | Watchko et al. | |
| 6,979,773 B2 | 12/2005 | Fursich | |
| 6,982,874 B2 | 1/2006 | Smalc et al. | |
| 6,989,994 B2 | 1/2006 | Maguire et al. | |
| 7,013,558 B2 | 3/2006 | Bachman | |
| 7,078,109 B2 | 7/2006 | Hill et al. | |
| 7,138,029 B2 | 11/2006 | Norley et al. | |
| 7,150,914 B2 | 12/2006 | Clovesko et al. | |
| 7,160,619 B2 | 1/2007 | Clovesko et al. | |
| 7,262,369 B1 * | 8/2007 | English | 174/370 |
| 7,267,273 B2 | 9/2007 | Silverbrook et al. | |
| 7,292,441 B2 | 11/2007 | Smalc et al. | |
| 7,303,820 B2 | 12/2007 | Capp et al. | |
| 7,306,847 B2 | 12/2007 | Capp et al. | |
| 7,317,618 B2 | 1/2008 | Robinson et al. | |
| 7,463,496 B2 | 12/2008 | Robinson et al. | |
| 7,486,517 B2 | 2/2009 | Aapro et al. | |
| 7,547,233 B2 * | 6/2009 | Inoue et al. | 439/627 |
| 7,576,988 B2 * | 8/2009 | Schwarz | 361/704 |
| 7,965,514 B2 | 6/2011 | Hill et al. | |
| 8,050,037 B2 * | 11/2011 | Tsuyuno et al. | 361/714 |
| 8,228,660 B2 * | 7/2012 | Fujii et al. | 361/274.1 |
| 2001/0046119 A1 | 11/2001 | Hamano et al. | |
| 2003/0066672 A1 | 4/2003 | Watchko et al. | |
| 2003/0224186 A1 | 12/2003 | Feng et al. | |
| 2004/0052064 A1 | 3/2004 | Oliver et al. | |
| 2004/0132503 A1 | 7/2004 | Chiu | |
| 2004/0244397 A1 | 12/2004 | Kim | |
| 2005/0236171 A1 | 10/2005 | Garcia | |
| 2005/0237727 A1 | 10/2005 | Baker | |
| 2006/0255450 A1 | 11/2006 | Pan et al. | |
| 2006/0263570 A1 | 11/2006 | Bunyan | |
| 2007/0042188 A1 | 2/2007 | Clovesko et al. | |
| 2007/0077434 A1 | 4/2007 | Clovesko et al. | |
| 2007/0103849 A1 | 5/2007 | Moon et al. | |
| 2007/0210082 A1 | 9/2007 | English et al. | |
| 2008/0151503 A1 | 6/2008 | Aapro et al. | |
| 2009/0310311 A1 | 12/2009 | Kondoh et al. | |
| 2010/0072952 A1 | 3/2010 | Nakajima | |
| 2010/0108291 A1 | 5/2010 | Onnerud et al. | |

FOREIGN PATENT DOCUMENTS

| | | |
|---|---|---|
| EP | 1493314 | 10/2006 |
| EP | 1742524 | 1/2007 |
| EP | 1993337 | 11/2008 |
| EP | 2262354 | 12/2010 |
| JP | 2003060369 | 2/2003 |
| JP | 4476999 | 6/2010 |
| WO | WO 87/04317 | 7/1987 |
| WO | WO 01/41521 | 6/2001 |
| WO | WO 02/069687 | 9/2002 |
| WO | WO 03/088729 | 10/2003 |
| WO | WO 2005/101931 | 10/2005 |

OTHER PUBLICATIONS

European Office Action for EP Application No. EP10164591.9 (now published as EP2262354) which also lists Richard F. Hill and Shahi Riaz as inventors, and includes a priority claim to U.S. Appl. No. 12/479,284, now U.S. Patent 7,965,514. U.S. Appl. No. 12/479,284 is the parent application for the instant application; dated Sep. 15, 2010; 4 pages.

Tflex™ 300 Series Thermal Gap Filler; www.lairdtech.com/thermal; 1 page.

Tpli™ 200 Series Gap Filler; www.lairdtech.com/thermal; 2 pages.
Tpcm™ 580 Series Phase Change Material; www.lairdtech.com/thermal; 2 pages.

Tflex™ 600 Series Thermal Gap Filler; www.lairdtech.com/thermal; 2 pages. Tgrease™ 880 Series Thermal Grease; www.lairdtech.com/thermal; 2 pages.

* cited by examiner

ASSEMBLIES AND METHODS FOR DISSIPATING HEAT FROM HANDHELD ELECTRONIC DEVICES

CROSS-REFERENCE TO RELATED APPLICATION

This application is a continuation-in-part of U.S. patent application Ser. No. 12/479,284, filed Jun. 5, 2009 (which will issue as U.S. Pat. No. 7,965,514 on Jun. 21, 2011). The entire disclosures of the aforementioned patent are incorporated herein by reference in their entirety.

FIELD

The present disclosure generally relates to assemblies and methods for dissipating heat from handheld electronic devices or other electronic device, by a thermally-conducting heat path that includes or is formed by one or more portions of an electromagnetic interference (EMI) board level shield (BLS) and/or thermal interface material (TIM) disposed around the battery area or battery of the electronic device.

BACKGROUND

This section provides background information related to the present disclosure which is not necessarily prior art.

Electronic components, such as semiconductors, transistors, etc., typically have pre-designed temperatures below which the electronic components optimally operate. Ideally, the pre-designed temperatures approximate the temperature of the surrounding air. But the operation of electronic components generates heat which, if not removed, will cause the electronic component to operate at temperatures significantly higher than its normal or desirable operating temperature. Such excessive temperatures may adversely affect the operating characteristics of the electronic component and the operation of the associated device. To avoid or at least reduce the adverse operating characteristics from the heat generation, the heat should be removed, for example, by conducting the heat from the operating electronic component to a heat sink. The heat sink may then be cooled by conventional convection and/or radiation techniques. During conduction, the heat may pass from the operating electronic component to the heat sink either by direct surface contact between the electronic component and heat sink and/or by contact of the electronic component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor. In some devices, an electrical insulator may also be placed between the electronic component and the heat sink, in many cases this is the TIM itself.

In addition, electronic equipment, devices, components, parts, etc. generate undesirable electromagnetic energy that can interfere with the operation of proximately located electronic equipment. Such EMI interference may adversely affect the operating characteristics of the electronic component and the operation of the associated device. Accordingly, it is not uncommon to provide shielding and/or grounding for electronic components that use circuitry that emits or is susceptible to electromagnetic interference. These components may be shielded to reduce undesirable electromagnetic interference and/or susceptibility effects with the use of a conductive shield that reflects or dissipates electromagnetic charges and fields. Such shielding may be grounded to allow the offending electrical charges and fields to be dissipated without disrupting the operation of the electronic components enclosed within the shield. By way of example, sources of undesirable electromagnetic energy are often shielded by a stamped metal enclosure.

As used herein, the term electromagnetic interference (EMI) should be considered to generally include and refer to both electromagnetic interference (EMI) and radio frequency interference (RFI) emissions. The term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a shielding device in which electronic equipment is disposed.

SUMMARY

This section provides a general summary of the disclosure, and is not a comprehensive disclosure of its full scope or all of its features.

According to various aspects of the present disclosure, exemplary embodiments include assemblies and methods for dissipating heat from an electronic device by a thermally-conducting heat path to the external casing via one or more portions of an electromagnetic interference shield and/or thermal interface material disposed around the device's battery or other power source. In an exemplary embodiment, a thermally conductive structure which comprises elastomer may be disposed about or define a battery area such that heat is transferable to the external casing by a thermally-conductive heat path around the battery area through or along the thermally conductive structure which comprises elastomer.

In another exemplary embodiment, an electronic device includes an exterior casing and a circuit board including one or more heat generating components. A battery area is between the circuit board and the exterior casing. An electromagnetic interference (EMI) shielding/thermal interface material is positioned relative to the one or more heat generating components to provide EMI shielding to the one or more heat generating components. A thermally-conductive heat path is provided from the one or more heat generating components to the exterior casing. The thermally-conductive heat path includes a portion around the battery area that is defined by one or more portions of the electromagnetic interference (EMI) shielding/thermal interface material, such that heat is transferable along the thermally-conductive heat path and portion thereof around the battery area.

Additional aspects of the present disclosure include methods relating to heat dissipation with thermally-conductive heat paths within electronic devices. In an exemplary embodiment, a method generally includes positioning a thermally conductive structure which comprises elastomer to establish a thermally-conductive heat path around a battery area between an exterior casing and a circuit board of the electronic device. The thermally-conductive heat path may allow heat transfer from one or more heat generating components on the circuit board within the electronic device to the exterior casing.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 3:
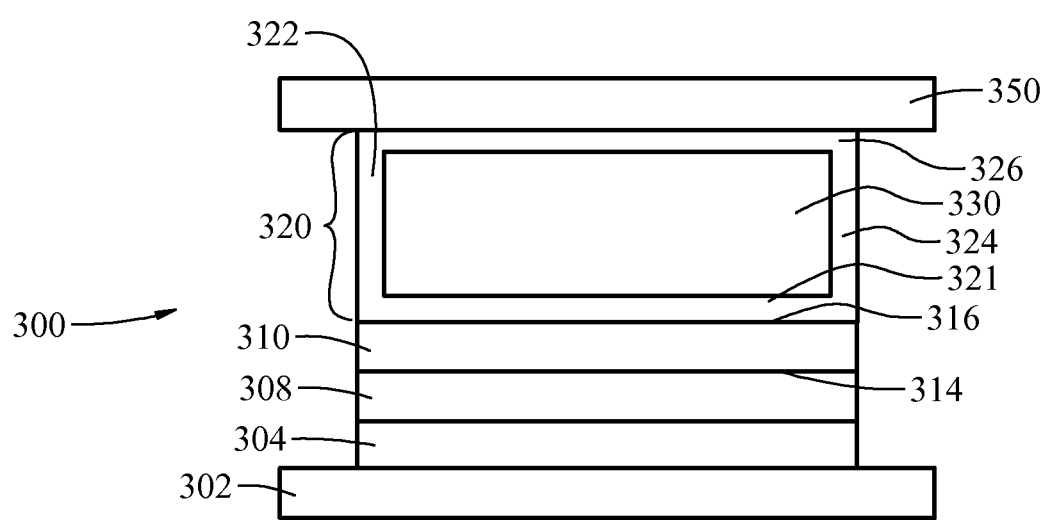
FIG. 3 is a diagram of an exemplary embodiment of an assembly in which a thermal interface material (TIM) is disposed about a battery area of an electronic device such that heat may be transferred to the device's external casing by a thermally-conductive heat path generally around the battery area (and battery therein) through or along the TIM.
Figure 6:
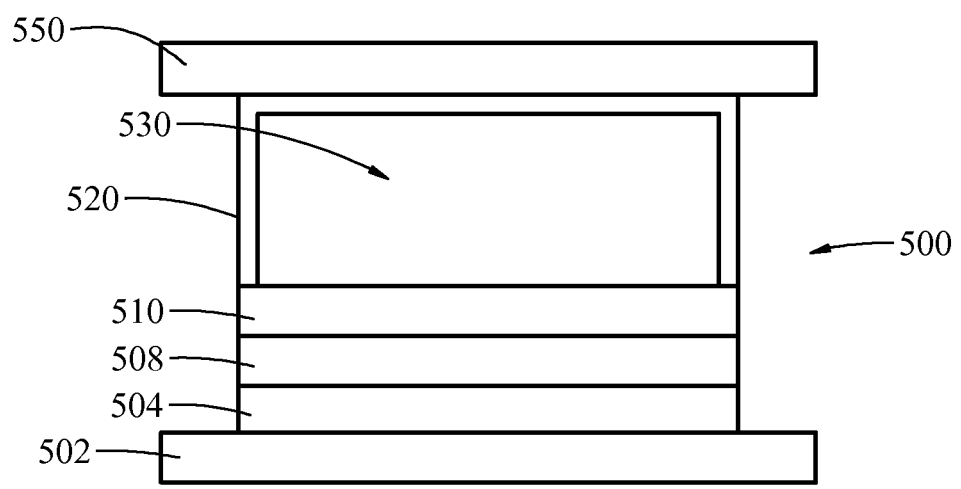
FIG. 6 is a diagram of another exemplary embodiment of an assembly in which a thermally-conductive heat path is provided or defined generally around a battery area of an electronic device by portions of a thermal interface material (TIM) and board level shield (BLS)
Figure 7:
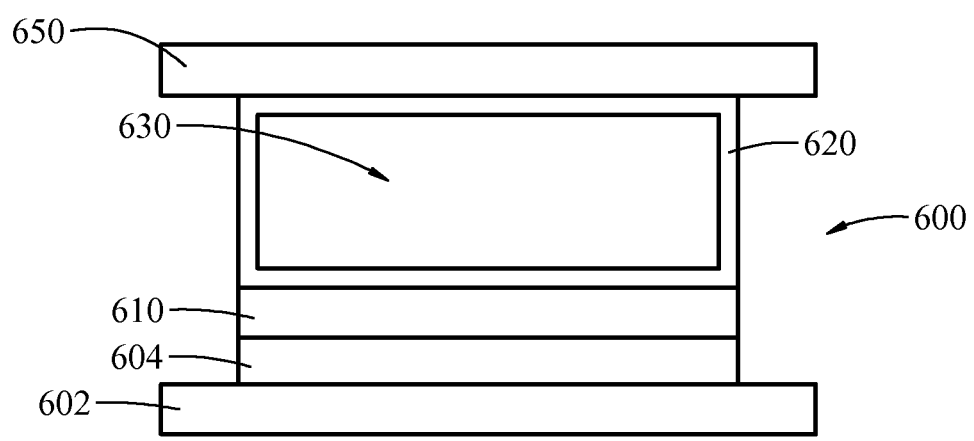
FIG. 7 is a diagram of an exemplary embodiment of an assembly in which a thermal interface material (TIM) is disposed about a battery area of an electronic device such that heat may be transferred to the device's external casing by a thermally-conductive heat path generally around the battery area (and battery therein) through or along the TIM.
Figure 8:
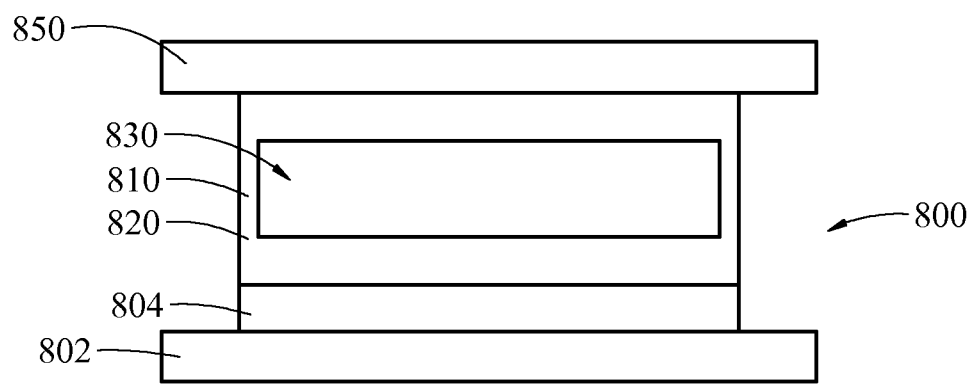
Figure 9:
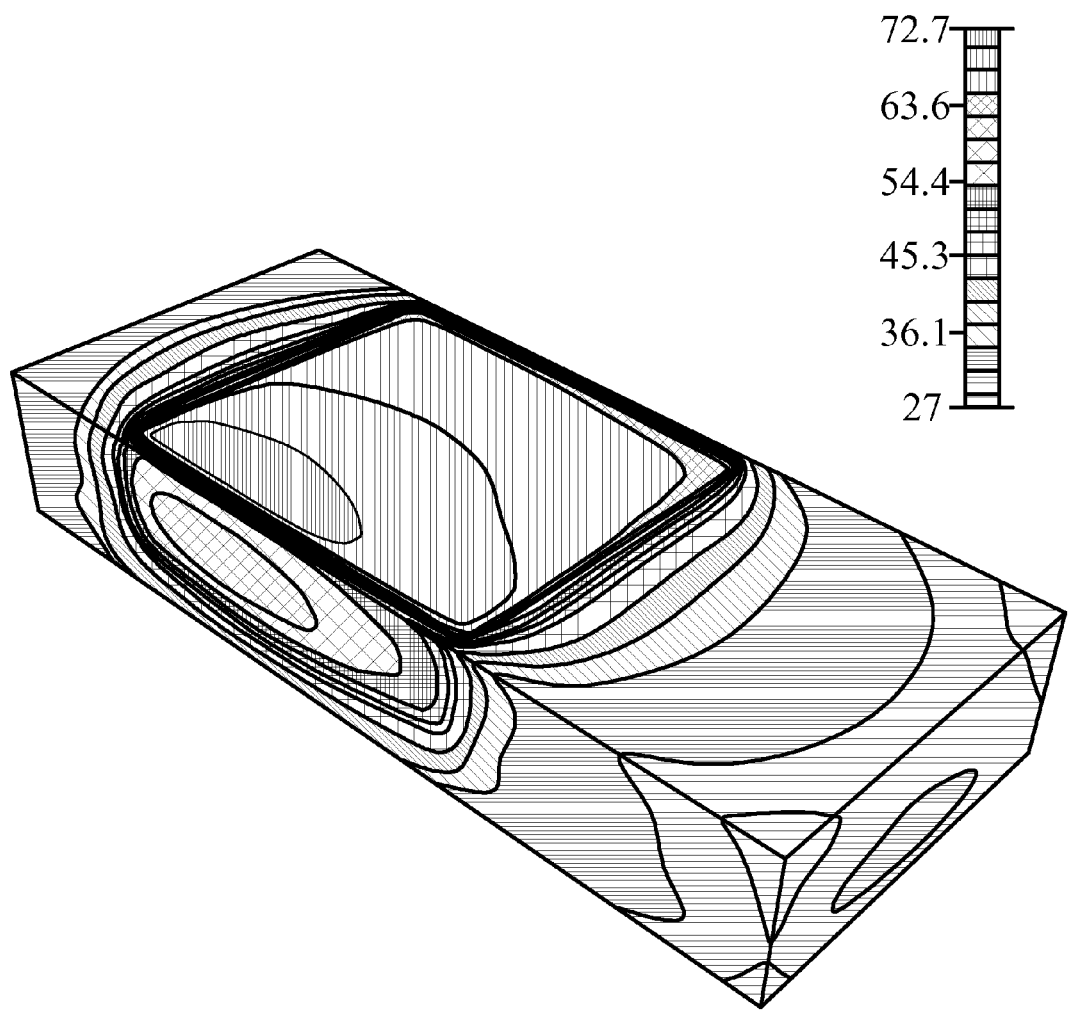
Figure 10:
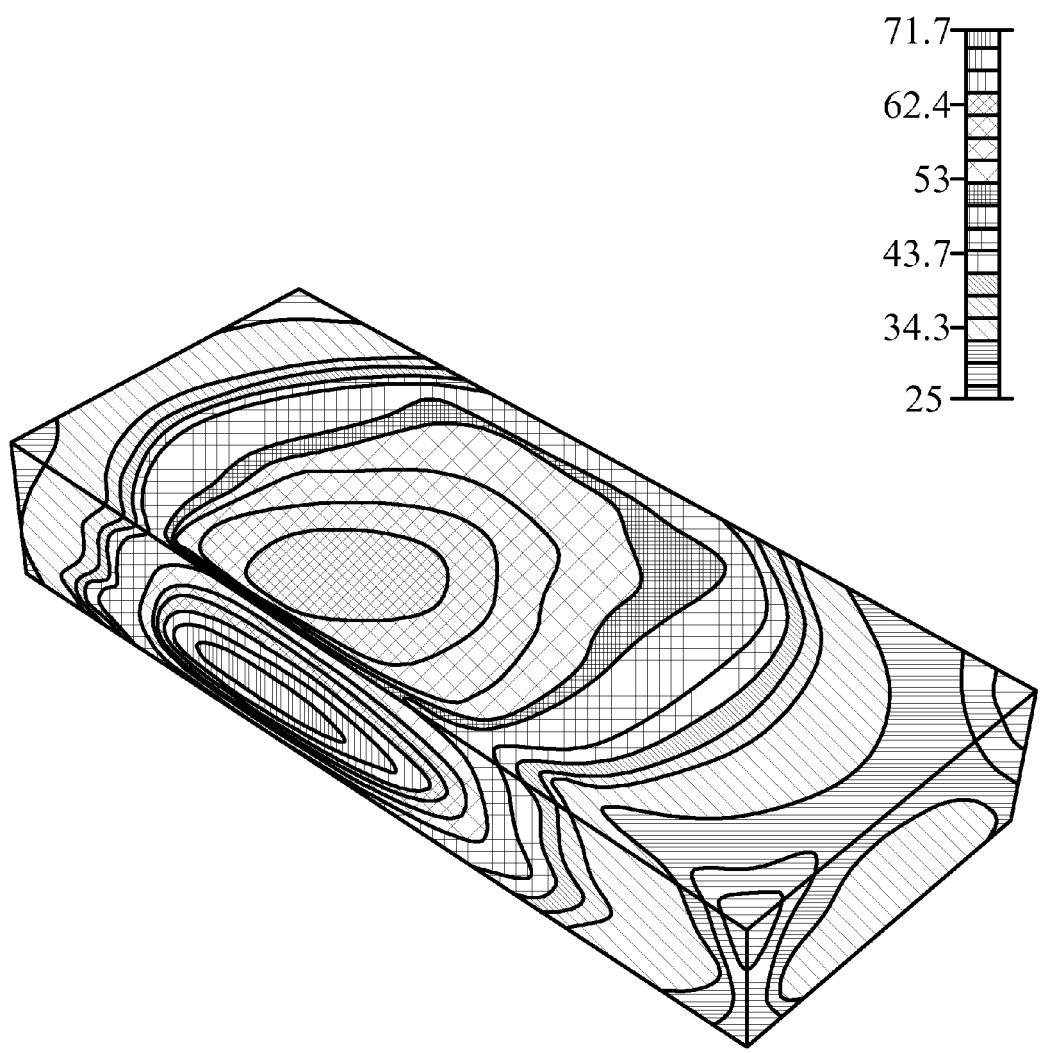
Figure 11:
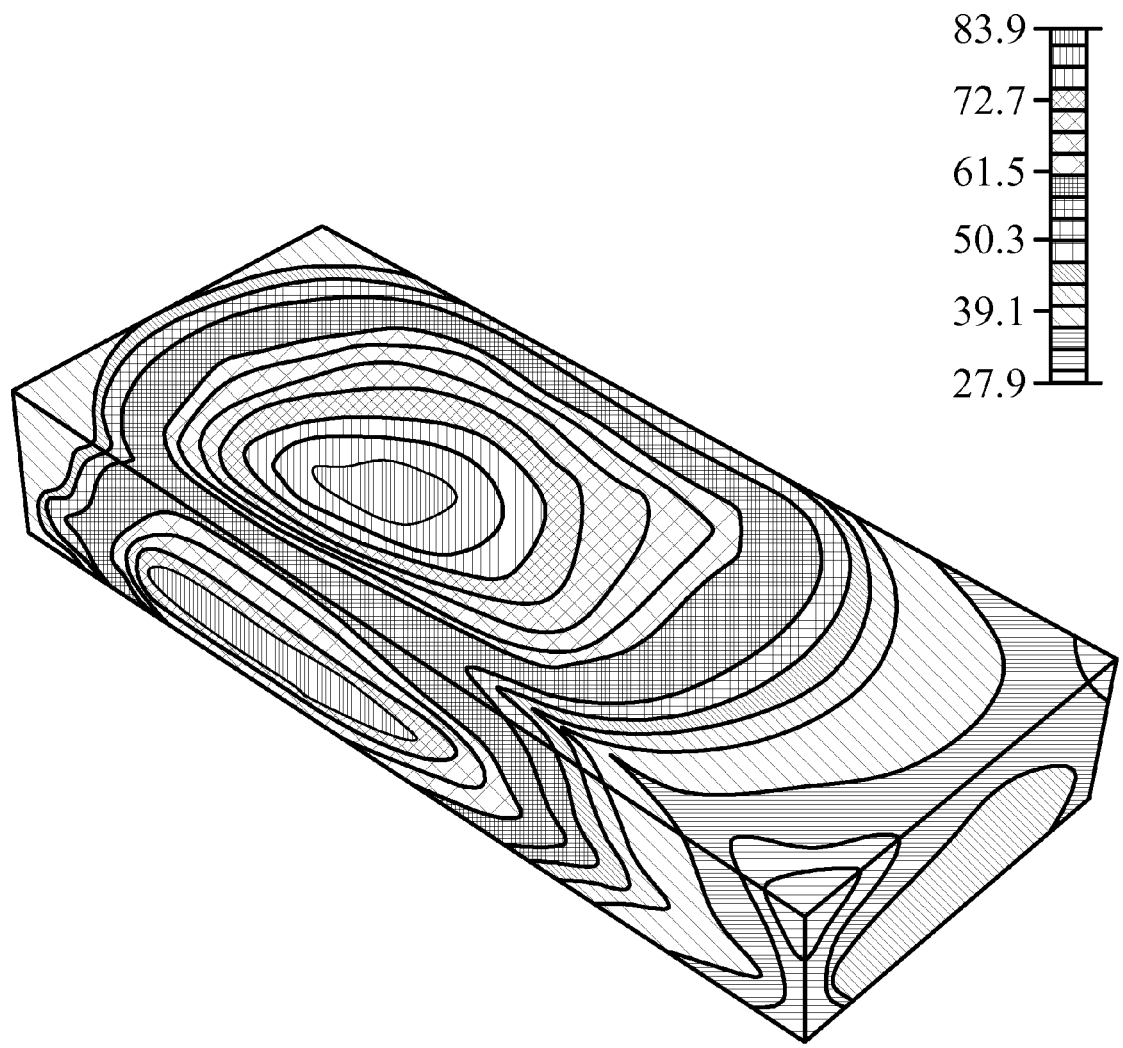
Figure 12:
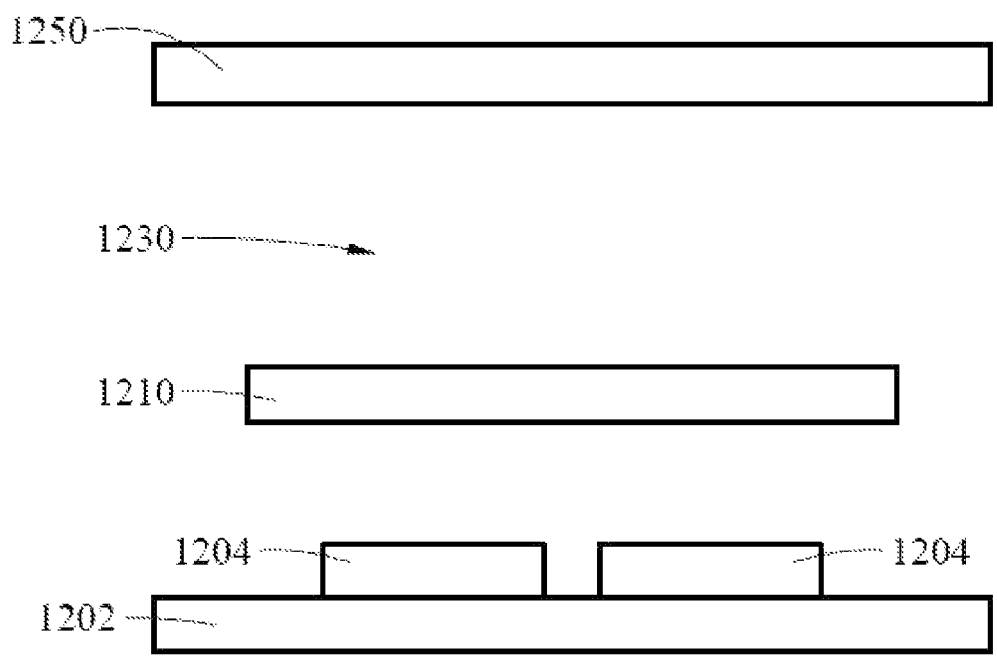
Figure 13:
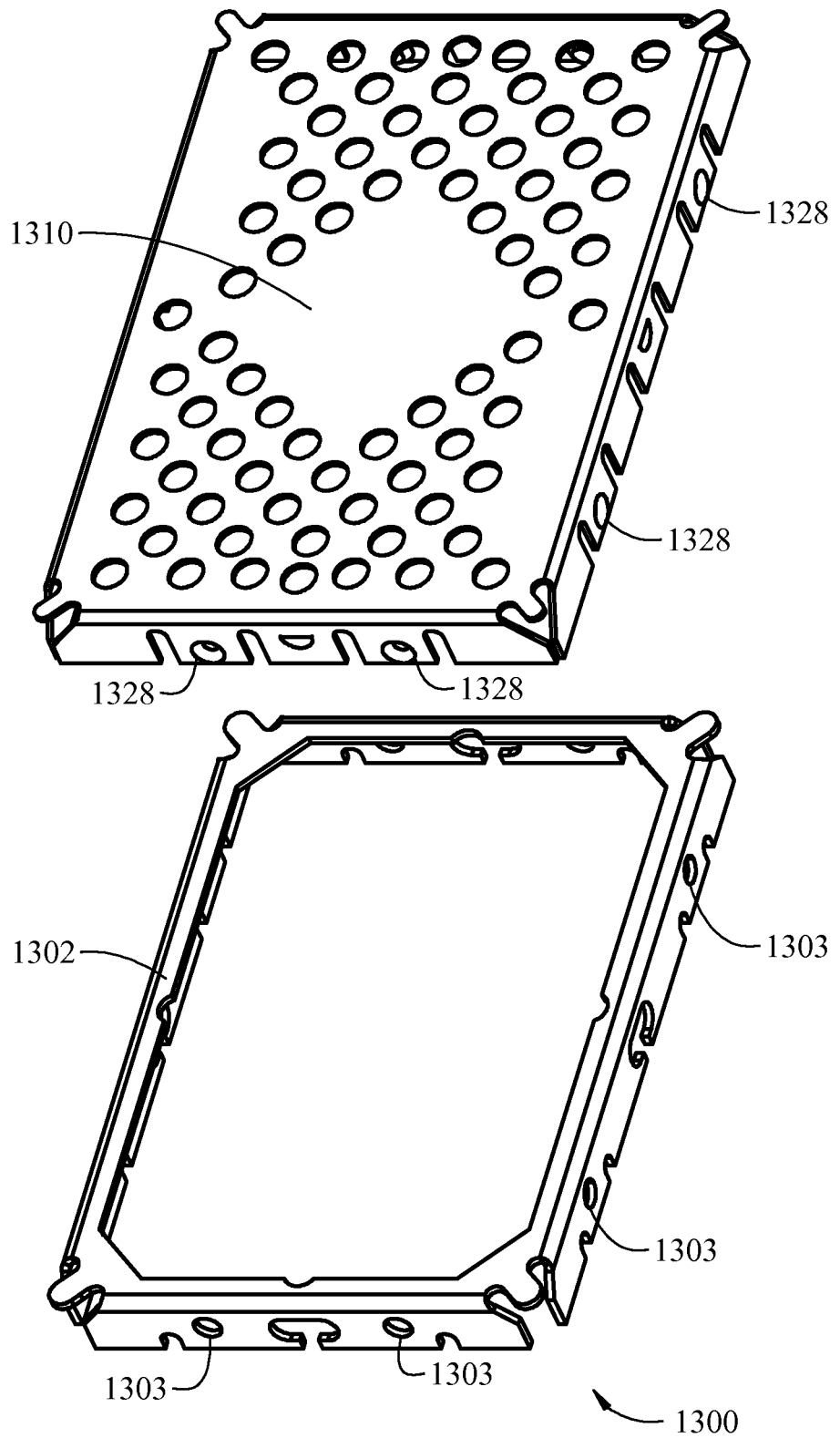
Figure 14:
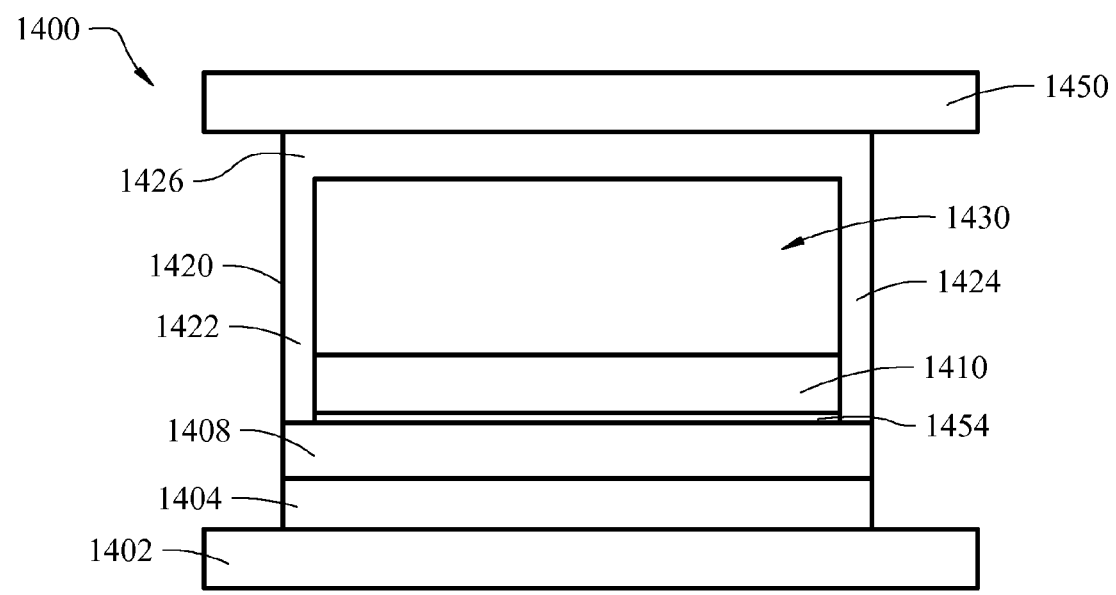
Figure 15:
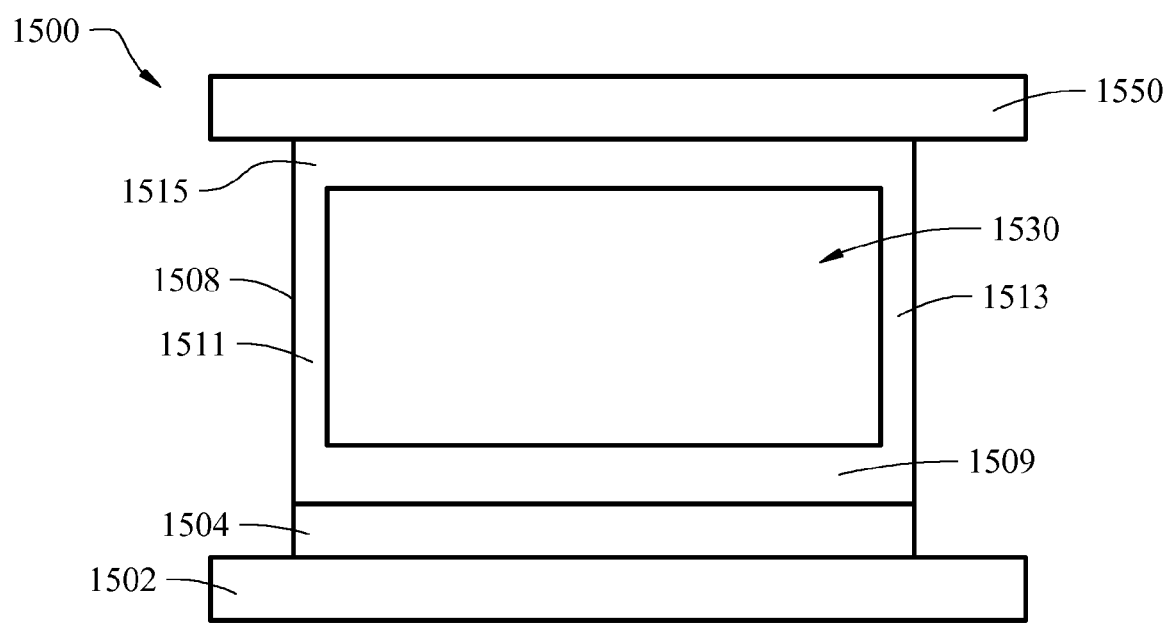

FIG. 8 is a diagram of an exemplary embodiment of an assembly in which an EMI shielding/thermal interface material (e.g., thermally and electrically conductive elastomer, etc.) is disposed about a battery area of an electronic device such that heat may be transferred to the device's external casing by a thermally-conductive heat path generally around the battery area (and battery therein) through or along the EMI shielding/thermal interface material;

FIG. 9 illustrates computational fluid dynamics (CFD) results showing external temperatures (in degrees Celsius) of an external casing of an electronic device, in which the computational model included a thermally-conductive heat path through a BLS around the battery area (and battery therein) in accordance with exemplary embodiments;

FIG. 10 illustrates CFD results showing external temperatures (in degrees Celsius) of an external casing of an electronic device, in which the computational model included a thermally-conductive heat path through a TIM around the battery area (and battery therein) in accordance with exemplary embodiments;

FIG. 11 illustrates CFD results showing external temperatures in degrees Celsius of an external casing of an electronic device, in which the computational model did not include a thermal solution or thermally-conductive heat around the battery area (and battery therein), for purposes of creating a baseline for comparison to FIGS. 9 and 10;

FIG. 12 is a diagram illustrating an assembly, which is represented by the baseline model without a thermal solution used to obtain the CFD results shown in FIG. 11;

FIG. 13 is an exploded perspective view of an exemplary embodiment of a two-piece BLS that may be used, for example, in the exemplary embodiments shown in FIG. 3, FIG. 6, and/or FIG. 7;

FIG. 14 is a diagram of another exemplary embodiment of an assembly in which a first TIM is installed or applied onto one or more heat generating components of a printed circuit board (PCB), a board level shield (BLS) is installed over the PCB component to provide EMI shielding, and a second TIM thermally contacts the first TIM and the exterior casing of the device such that a thermally-conductive heat path is provided or defined generally around a battery area of the device from the heat-generating components to the exterior casing; and FIG. 15 is a diagram of another exemplary embodiment of an assembly in which a TIM is installed or applied onto one or more heat generating components of a printed circuit board (PCB) such that a thermally-conductive heat path is provided or defined generally around a battery area of the device from the heat-generating components to the exterior casing.

DETAILED DESCRIPTION

Example embodiments will now be described more fully with reference to the accompanying drawings.

Heat from heat generating components must typically be dissipated to an area external to the enclosed circuit board, to avoid damage to heat producing components, such as a power amplifier. For example, heat from cellular phones and other portable communications terminals must typically be transported or transferred externally from the cellular phone to the surrounding ambient environment to avoid damage to the PCB components within the cellular phone.

A conventional cellular phone typically includes a board level shield (BLS) placed directly on the printed circuit board (PCB) over at least some of the heat producing and/or hot components on the PCB. With current cellular phones, the battery is typically placed above the PCB and BLS, which has heretofore prevented a direct thermally-conductive heat path from the heat source or heat producing components on the PCB to the cellular phone's external case, casing, or housing. In contrast to the conventional wisdom, the inventors have recognized the unique opportunity of using an EMI shield (e.g., BLS, etc.) as a heat spreader as well as a thermally-conductive heat path away from the hot components on the PCB to the external case of the cellular phone.

Disclosed herein are various embodiments of assemblies and methods for circumventing the problem (recognized by the inventors hereof) caused by having the battery located above the BLS and PCB. In various exemplary embodiments disclosed herein, heat may be dissipated and removed heat from an electronic device by way of a thermally-conducting heat path to the external casing via an EMI shield (or portions thereof) and/or a thermal interface material (TIM) (or portions thereof) disposed around the device's battery area and/or battery (or other power source).

In a first exemplary embodiment, at least a portion of an EMI shield (e.g., at least a portion of a BLS, etc.) may be configured (e.g., oversized, shaped, located, etc.) to be disposed (e.g., wrapped about a battery, etc.) about a battery area (e.g., compartment, etc.) of an electronic device (e.g., cellular phone, etc.) such that heat may be transferred to the device's external casing by a thermally-conductive heat path generally around the battery area (and battery or other power source therein) through or along the shield (or portions thereof). The shield may be configured for direct interface or physical contact with the device's external casing. Or, for example, a TIM may be disposed generally between the shield and the device's external casing. Additionally, or alternatively, a TIM may be disposed generally between the shield and the heat source or heat-producing components on the PCB. Some embodiments may include a thermally-conductive heat path that allows heat to be transferred from a heat source or heat-producing components on a PCB to a first TIM, from the first TIM to an EMI shield having one or more portions generally around the battery area, from the EMI shield to a second TIM, and finally from the second TIM to the device's external casing. In various embodiments, the casing may be formed from a material(s) such that the casing has a thickness of about 0.625 millimeters and a thermal conductivity (k) of 0.14 Watts per meter per Kelvin. These numerical values are provided for illustrative purposes only (as are all dimensions, numerical values, and specific materials disclosed herein). Other embodiments may include or be used with a casing having a different thickness and/or different thermal conductivity. In addition, some embodiments may include an electronic device casing that is provided with or includes (e.g., attached thereto, integrally formed with, injection molded with, etc.) EMI shielding material(s) disposed generally about the battery area of the casing, such that portions of a separate BLS are not necessarily positioned about the battery area within the casing. In other embodiments, EMI shielding material(s) may be attached to or wrapped about a battery (e.g., by the battery manufacturer, etc.) before the battery is inserted or positioned within the battery area of the casing.

In a second exemplary embodiment, at least a portion of a TIM may be configured (e.g., oversized, shaped, located, etc.) to be disposed (e.g., wrapped, etc.) about a battery area (e.g., compartment, etc.) of an electronic device (e.g., cellular phone, etc.) such that heat may be transferred to the device's external casing by a thermally-conductive heat path generally around the battery area (and battery or other power source therein) through or along the TIM (or portions thereof). The TIM may be configured for direct interface or physical contact with the device's external casing. Or, for example, another TIM may be disposed generally between the first TIM and the device's external casing. Additionally, or alternatively, the TIM may also include a portion disposed generally between the battery area and a EMI shield, which shield may be disposed generally over the heat source or heat-producing components on the PCB. In some embodiments, another TIM may be positioned generally between the shield and the heat source or heat-producing components on the PCB. Accordingly, some embodiments may include a thermally-conductive heat path that allows heat to be transferred from a heat source or heat-producing components on a PCB to a first TIM, from the first TIM to a shield, from the shield to a second TIM having one or more portions generally around the battery area, and finally from the second TIM to the device's external casing. In various embodiments, the casing may be formed from a material(s) such that the casing has a thickness of about 0.625 millimeters and a thermal conductivity (k) of 0.14 Watts per meter per Kelvin. These numerical values are provided for illustrative purposes only (as are all dimensions, numerical values, and specific materials disclosed herein). Other embodiments may include or be used with a casing having a different thickness and/or different thermal conductivity. In addition, some embodiments may include an electronic device casing that is provided with or includes (e.g., attached thereto, integrally formed with, injection molded with, etc.) one or more TIMs disposed generally about the battery area of the casing. In other embodiments, one or more TIMs (e.g., thermally-conductive compliant pads with adhesive backing, etc.) may be attached to or wrapped about a battery (e.g., by the battery manufacturer, etc.) before the battery is inserted or positioned within the battery area of the casing. By way of example, aluminum foil or copper foil (e.g., foil that is only a few mils thick, etc.) may be laminated with a TIM so as to provide a relatively rigid compartment into which a battery or other power source may be received. As another example, a battery manufacturing company may wrap a TIM around a battery, so that the "TIM wrapped battery" may then be inserted into the device's battery area or compartment. An additional example includes injection moldable thermally-conductive plastic to form the battery compartment of the device and thermally-conductive heat path around the battery compartment.

A third exemplary embodiment may include one or more materials that are operable as both an EMI shield and thermal interface. In such embodiments, an EMI shielding/thermal interface combination (e.g., thermally and electrically conductive elastomer, etc.) may be disposed generally between a device's casing and heat source on a PCB, so as to provide EMI shielding for one or more components on the PCB and to provide, define, or establish a thermally-conductive heat path from the heat source, generally around the device's battery area (and/or battery or other power source) to the device's casing. This thermal design solution preferably reduces the overall contact resistance between the heat source and the device's casing. In various embodiments, the casing may be formed from a material(s) such that the casing has a thickness of about 0.625 millimeters and a thermal conductivity (k) of 0.14 Watts per meter per Kelvin. These numerical values are provided for illustrative purposes only (as are all dimensions, numerical values, and specific materials disclosed herein). Other embodiments may include or be used with a casing having a different thickness and/or different thermal conductivity. In addition, some embodiments may include an electronic device casing that is provided with or includes (e.g., attached thereto, integrally formed with, injection molded with, etc.) the EMI shielding/thermal interface combination disposed generally about the battery area of the casing. In other embodiments, the EMI shielding/thermal interface combination may be attached to or wrapped about a battery (e.g., by the battery manufacturer, etc.) before the battery is inserted or positioned within the battery area of the casing.

Some embodiments disclosed herein may provide relatively low cost thermal solutions. Some embodiments disclosed herein may be relatively easy to install in the production process.

Figure 1:
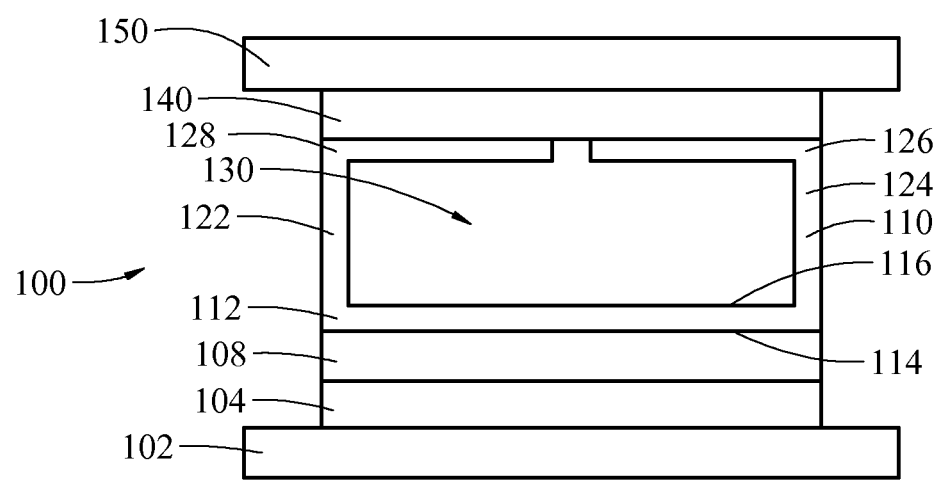
FIG. 1 is a diagram of an exemplary embodiment of an assembly in which a board level shield (BLS) is disposed about a battery area of an electronic device such that heat may be transferred to the device's external casing by a thermally-conductive heat path generally around the battery area (and battery therein) through or along the BLS.

Referring now to FIG. 1, there is shown an exemplary embodiment of an assembly 100 embodying one or more aspects of the present disclosure. In this particular embodiment, the assembly 100 is installed generally between a heat source 104 (e.g., heat generating board-mounted electronic components, etc.) on a printed circuit board (PCB) 102 and an external casing or housing 150 of an electronic device. As disclosed herein, the assembly 100 is operable for providing EMI shielding to one or more electronic components on the PCB 102 and also for providing a thermally-conductive heat path generally around the battery area 130. The thermally-conductive heat path allows heat from the heat source 104 to be transferred to the external casing 150 via a first thermal interface material (TIM) 108, an EMI shield 110, and a second interface material 140.

As shown in FIG. 1, the shield 110 is disposed generally about the battery area 130 such that heat may be transferred through the shield 110 generally around the battery area 130. In some embodiments, the shield 110 may be configured (e.g., oversized, etc.) such that a portion of the shield 110 may be wrapped (e.g., manually wrapped around the battery by the battery manufacturer, etc.) around a battery to be placed within the battery area 130. In other embodiments, the shield 110 may be sufficiently sized large enough or oversized so as to be positioned generally over the battery area 130, a battery (e.g., 132 shown in FIG. 2, etc.) therein, and one or more electronic components on the PCB 102. Alternative embodiments may include the shield having an upper thermally-conductive structure with sufficient rigidity so as to integrally define a portion or area into which the battery may then be at least partially positioned, for example, after the shield has been attached to the PCB.

The shield 110 is preferably configured so as to be operable as a heat spreader as well as being operable for providing EMI shielding. The particular configuration (e.g., size, shape, location, formation method, etc.) of the shield 110 will depend, at least in part, on the particular configuration of the battery area 130 (and battery to be received therein) and the PCB 102 and components 104 thereon. Therefore, a wide range of EMI shields may be used for the shield 110, such as a single piece board level shield (BLS), a two piece BLS, one or more discrete EMI shielding walls, etc.

In addition, a wide range of materials may also be used for the shield 110, which are preferably good electrical conductors and good thermal conductors. In various embodiments, the shield 110 may be made from copper-beryllium alloys, copper-nickel alloys, cold rolled steel, stainless steel, tin-plated cold rolled steel, tin-plated copper alloys, carbon steel, brass, copper, aluminum, phosphor bronze, steel, combinations thereof, among other suitable electrically conductive materials. In one exemplary embodiment, the shield 110 may be formed from a sheet of copper-beryllium alloy having a thickness of about 0.13 millimeter. The materials and dimensions provided herein are for purposes of illustration only, as the components thereof can be configured from different materials and/or with different dimensions depending, for example, on the particular application, such as the component to be shielded, space considerations within the overall electronic device, and heat dissipation needs.

As shown in FIG. 1, the shield 110 includes a generally horizontal portion 112 defining an underside or lower surface 114 and a topside or upper surface 116. In use, the shield portion 112 may be disposed generally over (and thus cover) one or more heat generating components 104 on the PCB 102. The shield 110 also includes an upper thermally-conductive structure that is configured to be positioned generally around or integrally define corresponding portions of the battery area 130. This upper thermally-conductive structure may be an integral part of the shield 110, or it may be provided otherwise, such as by separate attachment (e.g., welding, etc.) to the shield 110, etc.

Figure 2:
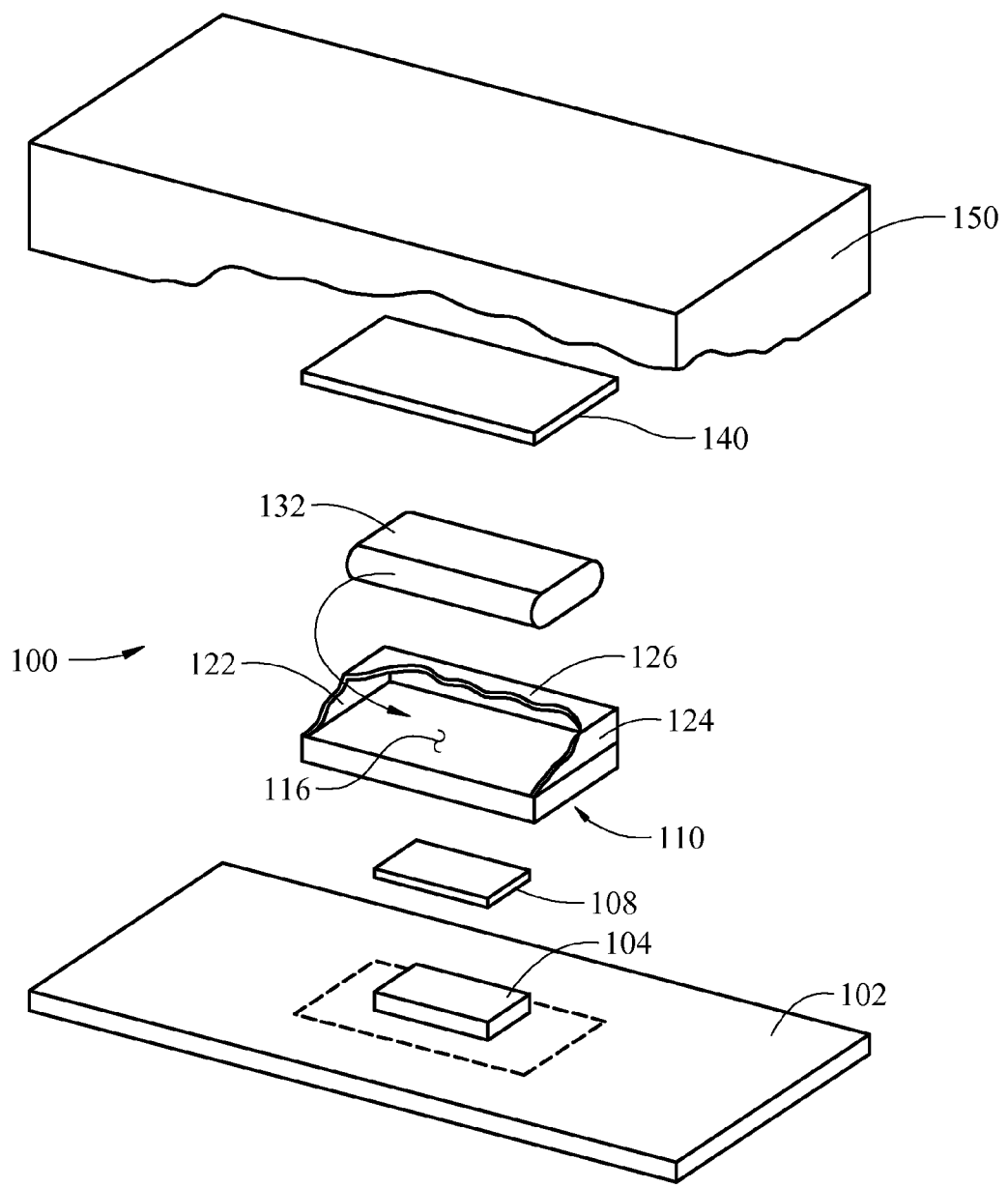
FIG. 2 is an exploded perspective view showing the various components of the assembly and electronic device of FIG. 1.

In the illustrated embodiment in FIGS. 1 and 2, the shield's upper thermally-conductive structure comprises or is integrally defined by the shield's portion 112, side portions 122, 124, and laterally extending portions 126, 128. In this particular illustration of FIG. 1, a space separates the portions 126, 128, though other embodiments may include a single continuous top portion without the separation. Also in this illustrated embodiment, the shield 110 is shown as a single piece shield having a monolithic construction. Advantageously, a single piece shield may allow for better heat transfer as compared to a multi-piece shield in which the pieces are connected via junctions or interfaces, which might otherwise transfer heat slower or less efficiently than a single, monolithic shield without any such junctions or interfaces. This nothwithstanding, alternative embodiments may include a shield formed from a plurality of pieces.

With continued reference to FIG. 1, the shield's side portions 122, 124 extend upwardly above the shield's portion 112. The shield's laterally extending portions 126 and 128 extend laterally inward from the side portions 122, 124, respectively. The shield's side portions 122, 124, laterally extending portions 126, 128, and portion 112 together form an area 130 configured to receive the battery or other power source. The shield's side portions 122, 124, laterally extending portions 126, 128, and portion 112 may be configured to be positioned generally around the battery area 130 (and battery therein) to thereby form a thermally-conductive heat path around the battery area 130 (and battery therein). Alternatively, the shield portions 122, 124, 126, 128 may be wrapped up and around the battery (e.g., by the battery manufacturer, etc.) before or after the battery is placed in the area 130.

The shield's thermally-conductive structure 112, 122, 124, 126, 128 allows heat to be transferred from the shield's portion 112 through the side portions 122, 124 and laterally extending portions 126, 128 above the area 130. In addition to the side portions 122, 124 that extend upwardly relative to the horizontal portion 112, the shield 110 may further include side portions that extend downwardly from the generally horizontal portion 112 below the underside 114, to thereby form an enclosure below the underside 114 in which the one or more heat generating components 104 may be housed.

With continued reference to FIGS. 1 and 2, the TIM 108 may be disposed generally between the underside 114 of the shield 110 and the heat producing components 104 on the PCB 102. The TIM 108 may comprise a thermally-conductive compliant material that is disposed or attached (e.g., mechanically or adhesively attached or bonded, etc.) to the underside 114 of the shield 110. In use, the TIM 108 provides for thermal conduction of heat from the one or more components 104 to the shield 110, thus facilitating the transfer of heat generated by the one or more components 104 to the shield 110.

As shown in FIG. 2, the shield 110 may be secured or attached (as indicated by the dashed line in FIG. 2) to the circuit board 102 generally over the one or more heat generating components 104. In some exemplary embodiments, the TIM 108 (e.g., thermally thermally-conductive compliant material, etc.) may be sandwiched, deformed, deflected, or compressed between the shield 110 and the one or more heat generating components 104, when the shield 110 is secured in place over the one or more heat generating components 104. For example, a force may be generated that deflects or deforms the TIM 108 generally between the shield's underside 114 and the top of one or more heat generating components 104. The force and resulting deflection/deformation of the TIM 108 against the upper portion of the one or more electronic components 104 may reduce thermal impedance therebetween.

The contact between the one or more heat generating components 104 and the TIM 108 creates a portion of a thermally-conducting heat path through which heat generated by a component 104 may be conducted from the component 104 through the TIM 108 to the shield 110, then through the shield's thermally-conductive structure 112, 122, 124, 126, 128 generally around the battery area 130 to the TIM 140, and finally to the exterior casing 150 for dissipation to the surrounding ambient environment or area external to the casing

150. The deflection or deformation of the TIM 108 between the shield 110 and component 104 can thus allow for improved heat transfer from the component 104 to the shield 110, as compared to heat transfer solely by air.

In the exemplary embodiment shown in FIGS. 1 and 2, a second thermal interface material (TIM) 140 is positioned generally between the shield 110 and exterior casing 150. The second TIM 140 contacts the laterally extending portions 126, 128 of the shield 110. The TIM 140 is operable for thermally conducting heat from the shield 110 to the casing 150.

The TIMs 108, 140, and the shield 110 (portions 112, 122, 124, 126, 128) provide, establish, or define a thermal-conducting heat path from the one or more heat generating components 104 to the casing 150. Accordingly, the shield 110 and TIMs 108, 140 are operable and useful as a heat-transmitter and/or heat-spreader to conduct heat from heat generating components 104 around the battery area 130 to the casing 150, to thereby help improve thermal performance by conducting and/or dissipating heat to an area external to the casing 150.

FIG. 3 illustrates another exemplary embodiment of an assembly 300 embodying one or more aspects of the present disclosure. In this particular embodiment, the assembly 300 is installed generally between a heat source 304 (e.g., heat generating board-mounted electronic components, etc.) on a printed circuit board (PCB) 302 and an external casing or housing 350 of an electronic device. As disclosed herein, the assembly 300 is operable for providing EMI shielding to one or more components on the PCB 302 and also for providing a thermally-conductive heat path generally around the battery area 330. The thermally-conductive heat path allows heat from the heat source 304 to be transferred to the external casing 350 via a first thermal interface material (TIM) 308, an EMI shield 310, and a second interface material or thermally-conductive structure 320, which is disposed around or defines the battery area 330.

As shown in FIG. 3, the TIM 320 is disposed generally about or defines the battery area 330 such that heat may be transferred through the TIM 320 generally around the battery area 330. In some embodiments, the TIM 320 may be sufficiently sized large enough or oversized so as to be wrapped (e.g., manually wrapped around a battery by a battery manufacturer, etc.) up and around the battery (e.g., 332 shown in FIG. 4, etc.) before or after placement within the battery area 330. In such embodiments, the TIM 320 may be attached (e.g., adhesively attached, bonded, etc.) to the shield 310 prior to or after being wrapped around the battery. In other embodiments, the TIM 320 may be a sufficiently rigid material that integrally defines a portion or area into which the battery may then be at least partially positioned. In other embodiments, the TIM 320 may comprise one or more thermally-conductive pads with adhesive backing that are attached to a battery before the battery is inserted or positioned within the battery area of the casing. By way of example, aluminum foil or copper foil (e.g., foil that is only a few mils thick, etc.) may be laminated with the TIM so as to provide a relatively rigid compartment into which a battery or other power source may be received. As another example, a battery manufacturing company may wrap a TIM around a battery, so that the "TIM wrapped battery" may then be inserted into the device's battery area or compartment. An additional example includes injection moldable thermally-conductive plastic to form the battery compartment of the device and thermally-conductive heat path around the battery compartment.

The particular configuration (e.g., size, shape, location, formation method, etc.) of the TIM 320 will depend, at least in part, on the particular configuration of the battery area 330 and battery to be received therein. Therefore, a wide range of TIM configurations may be used for the TIM 320, such as a single TIM piece that is wrapped about the battery, a plurality of TIM pieces, etc.

As shown in FIG. 3, the TIM 320 generally includes portions 321, 322, 324, and 326 that are respectively disposed around or define the battery area 330, thus forming a thermally-conducting heat path around the battery area 330 to the casing 350. In the illustrated embodiment, the TIM 320 is shown as a single piece shield having a monolithic construction that includes all four portions 321, 322, 324, and 326. Advantageously, a single piece TIM may allow for better heat transfer as compared to a multi-piece TIM in which the TIM pieces are connected via junctions or interfaces, which might otherwise transfer heat slower or less efficiently than a single, monolithic TIM without any such junctions or interfaces. This notwithstanding, alternative embodiments may include a multi-piece TIM having two or more pieces of thermal interface material. The TIM portion 321 may be attached (e.g., adhesively attached, bonded, etc.) to the topside 316 of the shield 310 prior to or after installation to the electronic device.

In this illustrated embodiment, the upper and lower portions 321, 326 are generally horizontal and parallel to each other, whereas the side portions 322, 324 are generally vertical and parallel to each other. These portions 321, 322, 324, and 326 cooperatively define a generally rectangular area in which at least a portion of the battery may be received. Alternative embodiments may include a different configuration for the TIM 320. And, the particular horizontal and vertical orientations of the TIM portions will depend on the orientation of the electronic device in which the TIM is installed.

The shield 310 may be configured to be disposed generally over (and thus cover) one or more heat generating components 304 on the PCB 302. The particular configuration (e.g., size, shape, location, formation method, etc.) of the shield 310 will depend, at least in part, on the particular configuration of the PCB 302 and components 304. Thus, a wide range of EMI shields may be used for the shield 310, such as a single piece board level shield (BLS), a two piece BLS, one or more discrete EMI shielding walls, a two-piece shield 1300 shown in FIG. 13, etc.

In addition, a wide range of materials may also be used for the shield 310, which are preferably good electrical conductors and good thermal conductors. In various embodiments, the shield 310 may be made from, copper-beryllium alloys, copper-nickel alloys, cold rolled steel, stainless steel, tin-plated cold rolled steel, tin-plated copper alloys, carbon steel, brass, copper, aluminum, phosphor bronze, steel, combinations thereof, among other suitable electrically conductive materials. In one exemplary embodiment, the shield 310 may be formed from a sheet of copper-beryllium alloy having a thickness of about 0.13 millimeter. The materials and dimensions provided herein are for purposes of illustration only, as the components thereof can be configured from different materials and/or with different dimensions depending, for example, on the particular application, such as the component to be shielded, space considerations within the overall electronic device, and heat dissipation needs.

Figure 4:
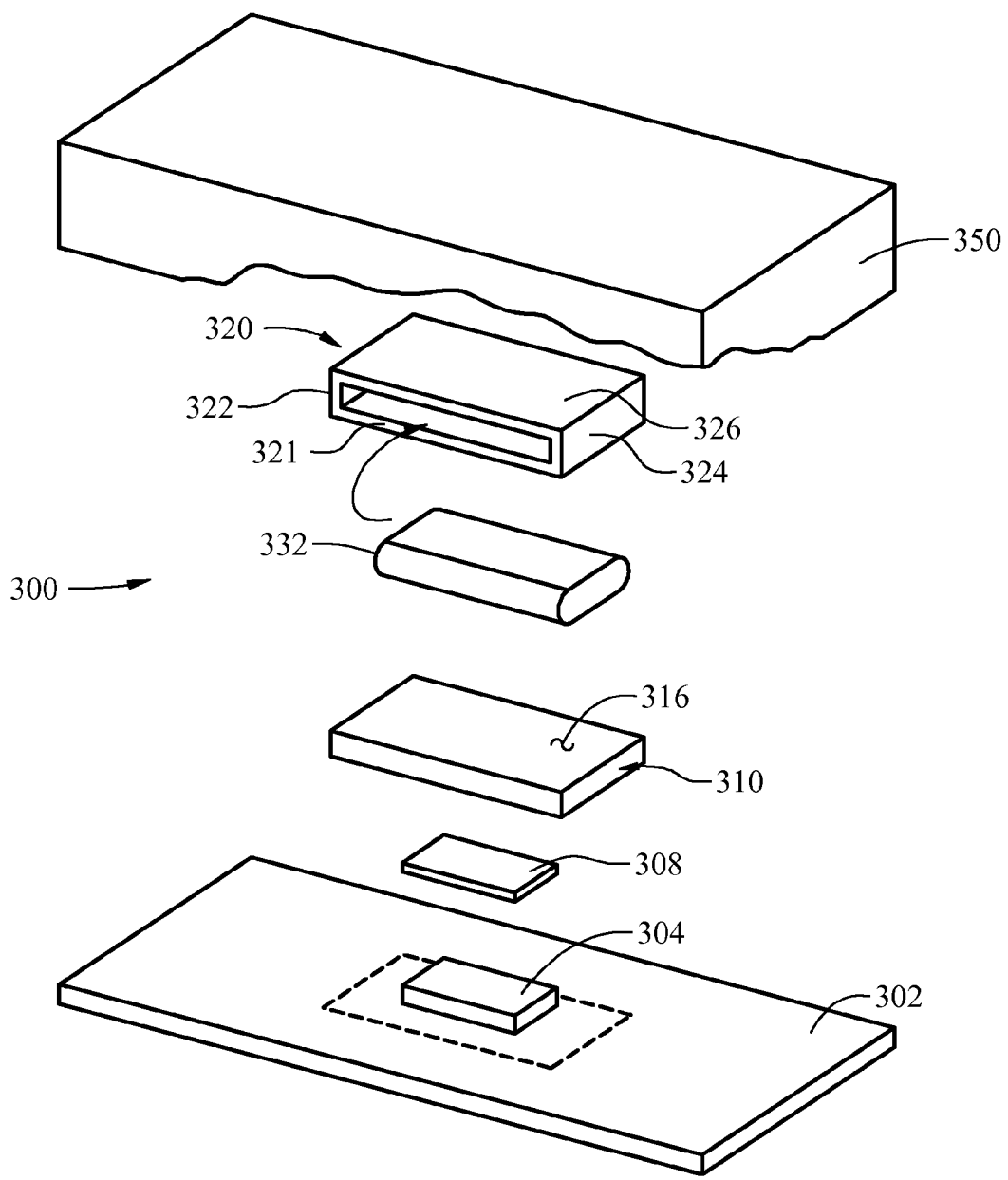
FIG. 4 is an exploded perspective view showing various components of the assembly and electronic device of FIG. 3.

In the illustrated embodiment of FIGS. 3 and 4, the shield 310 includes an upper surface or topside 316 and a lower surface or underside 314. The TIM 308 may be disposed generally between the shield's underside 314 and the heat producing components 304 on the PCB 302. The TIM 308 may comprise a thermally-conductive compliant material that is disposed or attached (e.g., adhesively attached, bonded, etc.) to the shield's underside 314. In use, the TIM 308 provides for thermal conduction of heat from the one or more components 304 to the shield 310, thus facilitating the transfer of heat generated by one or more components 304 to the cover 310.

As shown in FIG. 4, the shield 310 may be secured or attached (as indicated by the dashed line in FIG. 4) to the circuit board 302 generally over the one or more heat generating components 304. In some exemplary embodiments, the TIM 308 (e.g., thermally thermally-conductive compliant material, etc.) may be sandwiched, deflected, deformed, or compressed between the shield 310 and the one or more heat generating components 304, when the shield 310 is secured in place over the one or more heat generating components 304. For example, a force may be generated that deflects or deforms the TIM 308 generally between the shield's underside 314 and the top of one or more heat generating components 304. The force and resulting deflection or deformation of the TIM 308 against the upper portion of the one or more electronic components 304 may reduce thermal impedance therebetween.

The contact between the one or more heat generating components 304 and the TIM 308 creates a portion of a thermally-conducting heat path through which heat generated by an electronic component 304 may be conducted from the component 304 through the TIM 308 to the shield 310, then through the portions 321, 322, 324, 326 of the TIM 320 generally around the battery area 330, and finally to the exterior casing 350 for dissipation to the surrounding ambient environment or area external to the casing 350. The deflection or deformation of the TIM 308 between the shield 310 and electronic component 304 can thus allow for improved heat transfer from the electronic component 304 to the shield 310, as compared to heat transfer solely by air.

The TIM 308, shield 310, and portions 321, 322, 324, and 326 of the TIM 320 provide, establish, or define a thermal-conducting heat path from the one or more heat generating components 304 to the casing 350. Accordingly, the shield 310 and TIMs 308, 320 are operable and useful as a heat-transmitter and/or heat-spreader to conduct heat from heat generating components 304 around the battery area 330 to the casing 350, to thereby help improve thermal performance by conducting and/or dissipating heat to an area external to the casing 350.

Figure 5:
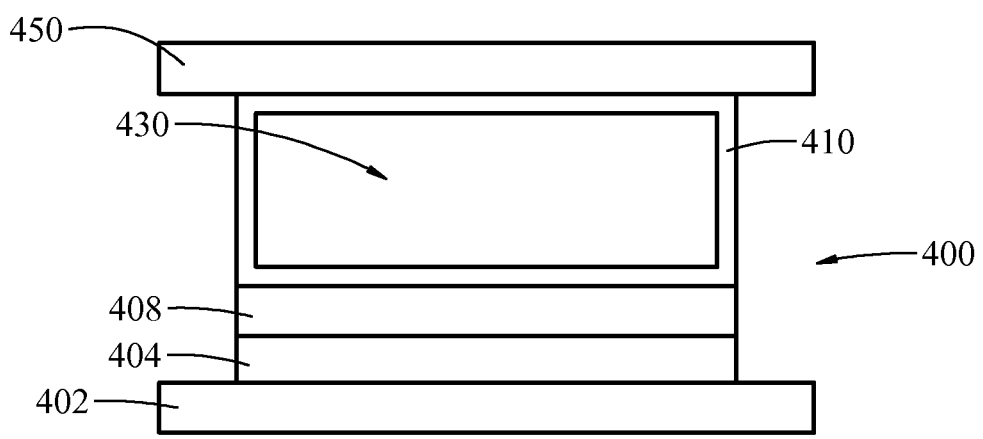
FIG. 5 is a diagram of another exemplary embodiment of an assembly in which a board level shield (BLS) is disposed about a battery area of an electronic device such that heat may be transferred to the device's external casing by a thermally-conductive heat path generally around the battery area (and battery therein) through or along the BLS.

FIG. 5 illustrates another exemplary embodiment of an assembly 400 embodying one or more aspects of the present disclosure. In this particular embodiment, the assembly 400 is installed generally between a heat source 404 (e.g., heat generating board-mounted electronic components, etc.) on a printed circuit board (PCB) 402 and an external casing or housing 450 of an electronic device. The assembly 400 is operable for providing EMI shielding to one or more electronic components on the PCB 402 and also for providing a thermally-conductive heat path generally around the battery area 430. The thermally-conductive heat path allows heat from the heat source 404 to be transferred to the external casing 450 via a first thermal interface material (TIM) 408 and the EMI shield 410. In comparison to the assembly 100 shown in FIG. 1, this assembly 400 does not include a second interface material between the casing 450 and shield 410, such that heat may be transferred from the shield 410 directly to the exterior casing 450. In this exemplary embodiment, the shield 410 may be polymer-based or other suitable material.

In other embodiments, an assembly may also include a shield disposed generally around the battery area without any thermal interface materials. In such alternative embodiments, heat would thus be transferred from the heat source directly to the shield, then through or along the shield generally around the battery area, and then from the shield directly to the casing.

In still further embodiments, an assembly may include a shield disposed generally around the battery area with a thermal interface material only between the shield and the heat source. In these embodiments, the assembly would not include a thermal interface material between the shield and the casing. In such embodiments, heat would thus be transferrable from the heat source to the TIM, through or along the TIM, from the TIM to the shield, through or along the shield around the battery area, and then from the shield directly to the casing.

FIG. 6 illustrates another exemplary embodiment of an assembly 500 embodying one or more aspects of the present disclosure. In this particular embodiment, the assembly 500 is installed generally between a heat source 504 (e.g., heat generating board-mounted electronic components, etc.) on a printed circuit board (PCB) 502 and an external casing or housing 550 of an electronic device. The assembly 500 is operable for providing EMI shielding to one or more electronic components 504 on the PCB 502 and also for providing a thermally-conductive heat path generally around the battery area 530. The thermally-conductive heat path allows heat from the heat source 504 to be transferred to the external casing 550 via a first thermal interface material (TIM) 508, the EMI shield 510, and the second TIM 520. In comparison to the assembly 300 shown in FIG. 3, this assembly 500 does not include the bottom or lowest TIM portion 321, such that the heat path around the battery area 530 includes or is defined by portions of the TIM 520 and shield 510.

FIG. 7 illustrates another exemplary embodiment of an assembly 600 embodying one or more aspects of the present disclosure. In this particular embodiment, the assembly 600 is installed generally between a heat source 604 (e.g., heat generating board-mounted electronic components, etc.) on a printed circuit board (PCB) 602 and an external casing or housing 650 of an electronic device. The assembly 600 is operable for providing EMI shielding to one or more electronic components on the PCB 602 and also for providing a thermally-conductive heat path generally around the battery area 630. The thermally-conductive heat path allows heat from the heat source 604 to be transferred to the external casing 650 via the EMI shield 610 and the thermal interface material (TIM) 620. This particular embodiment does not include thermal interface material between the heat source 604 and the shield 610, such that heat may be transferred from the heat source 604 directly to the shield 610.

With continued reference to FIG. 7, the TIM 620 is disposed generally around or defines the battery area 630, thus forming a thermally-conducting heat path around the battery area 630 to the casing 650. While FIG. 7 illustrates the TIM 620 as a single piece of thermal interface material, other embodiments may include two or more pieces of thermal interface material disposed about or defining the battery area.

FIG. 8 illustrates another exemplary embodiment 800 embodying one or more aspects of the present disclosure. By way of example, the embodiment 800 may include a material(s) operable as both an EMI shield 810 and as a thermal interface 820. As shown in FIG. 8 the EMI shielding/thermal interface combination 810, 820 (e.g., electrically and thermally conductive elastomer, etc.) is installed generally between a heat source 804 (e.g., heat generating board-mounted electronic components, etc.) on a printed circuit board (PCB) 802 and an external casing or housing 850 of an electronic device. The combined EMI shielding/thermal interface 810, 820 is operable for providing EMI shielding to one or more components on the PCB 802 and also for providing a thermally-conductive heat path generally around the battery area 830. The thermally-conductive heat path allows heat from the heat source 804 to be transferred to the external casing 850 via the EMI shielding/thermal interface 810, 820. This particular embodiment does not include an EMI shield that is separate from a thermal interface material. By having a combined EMI shield/thermal interface, this embodiment may help reduce the overall contact resistance between the heat source and the device's casing.

As another example, however, the embodiment 800 may include only a thermal interface material 820 without any EMI shielding 810. In such example, the thermal interface material 820 would operable for providing a thermally-conductive heat path generally around the battery area 830. The thermally-conductive heat path allows heat from the heat source 804 to be transferred to the external casing 850 via the thermal interface 820.

In a further example, the embodiment 800 may include only the EMI shield 810 without any interface material 820. In this example then, the EMI shield 810 would be operable for providing EMI shielding to one or more components on the PCB 802 and also for providing a thermally-conductive heat path generally around the battery area 830. The thermally-conductive heat path allows heat from the heat source 804 to be transferred to the external casing 850 via the EMI shield 810.

FIG. 14 illustrates another exemplary embodiment 1400 embodying one or more aspects of the present disclosure. As shown in FIG. 14, the assembly 1400 is installed generally between a heat source 1404 (e.g., heat generating board-mounted electronic components, etc.) on a printed circuit board (PCB) 1402 and an external casing or housing 1450 of an electronic device. The assembly 1400 is operable for providing EMI shielding to one or more electronic components 1404 on the PCB 1402 and also for providing a thermally-conductive heat path generally around the battery area 1430. More specifically, the thermally-conductive heat path allows heat from the heat source 1404 to be transferred to the external casing 1450 via a first thermal interface material (TIM) 1408 in contact with the PCB components 1404 and a second thermal interface material 1420 in contact with the first TIM 1408 and casing 1450.

Also shown in FIG. 14 is an EMI shield 1410 (e.g., board level shield (BLS), etc.) is installed over the PCB components 1404 and the first TIM 1408. In this embodiment, the first TIM 1408 may first be installed on the PCB components 1404. Then, the EMI shield 1410 may be installed (e.g., snapped onto a frame, etc.) such that an air gap 1454 separates the EMI shield 1410 from the first TIM 1408. In other embodiments, the EMI shield 1410 may contact the first TIM 1408.

Also FIG. 14 illustrates the EMI shield 1410 in contact with the second TIM 1420. But this contact between the EMI shield 1410 and the second TIM 1420 may be minimal or relatively insignificant such that the EMI shield 1410 is not a part of the primary heat conduction path from the PCB components 1404 to the casing 1450. In other embodiments, the EMI shield 1410 may be configured (e.g., sized, shaped, etc.) such that it does not contact the second TIM 1420.

While the EMI shield 1410 may conduct heat in some embodiments, the primary heat conduction heat path in this embodiment 1400 illustrated in FIG. 14 is defined or provided by the first and second TIMs 1408, 1420. More specifically, the TIM 1420 includes lateral or side portions 1422, 1424 extending downward into contact with the first TIM 1408. These side portions 1422, 1424 extend upward to the top or upper portion 1426 of the second TIM 1420, which, in turn, is in contact with the casing 1450. Accordingly, heat is transferrable from the heat source 1404 to the first TIM 1408, upwards through the side portions 1422, 1424 of the second TIM 1420, to the upper portion 1426 of the second TIM 1420, and then to the casing 1450.

In the particular illustration of FIG. 14, the second TIM 1420 is shown as a single piece having a monolithic construction. Advantageously, this single piece TIM may allow for better heat transfer as compared to multiple TIMs which are connected or contact via junctions or interfaces, which might otherwise transfer heat slower or less efficiently than a single, monolithic TIM without any such junctions or interfaces. This notwithstanding, alternative embodiments may include a second TIM 1420 formed from a plurality of pieces.

Advantageously, the overall contact resistance between the heat source 1404 and casing 1450 may be reduced by having the primary heat conduction path formed or provided solely by first and second TIMs 1408, 1420 that are conformable and without non-conformable, rigid metal EMI shield forming part of the primary heat conduction path.

In some embodiments, the TIMs 1408 and 1420 are thermally and electrically conductive elastomer (e.g., elastomer and thermally conductive filler, etc.), such that the TIMs 1408, 1420 may provide some EMI shielding though the EMI shield 1410 would be the primary EMI shielding component. Alternative embodiments may include other suitable materials besides thermally and electrically conductive elastomer. In other example embodiments, the first and second TIMs 1408, 1420 may be thermally conductive electrical insulators in which case the TIMs 1408, 1420 would not provide any EMI shielding.

Alternative embodiments may include one or more TIMs without any EMI shield. In such alternative embodiments, the one or more TIMs may be installed or applied relative to one or more heat generating components of a printed circuit board (PCB) such that a thermally-conductive heat path is provided or defined generally around a battery area of the device from the heat-generating components to the exterior casing.

For example, FIG. 15 illustrates an embodiment 1500 that includes only the thermal interface material 1508 without any EMI shield. In this example then, the TIM 1508 is operable for providing a thermally-conductive heat path generally around the battery area 1530. The thermally-conductive heat path allows heat from the heat source 1504 to be transferred to the external casing 1550 via the TIM 1508.

With continued reference to FIG. 15, the TIM 1508 includes an bottom or lower portion 1509 in contact with the heat source 1504 (e.g., PCB components, etc.). The TIM 1508 also includes lateral or side portions 1511, 1513 extending upwards from the lower portion 1509 to the top or upper portion 1515 of the TIM 1508. The upper portion 1515 is in contact with the casing 1550. Accordingly, heat is transferrable from the heat source 1504 to the TIM lower portion 1509, upwards through the TIM side portions 1511, 1513, to the TIM upper portion 1515, and then to the casing 1550.

In the particular illustration of FIG. 15, the TIM 1508 is shown as a single piece having a monolithic construction. Advantageously, a single piece TIM may allow for better heat transfer as compared to multiple TIMs which are connected or contact via junctions or interfaces, which might otherwise transfer heat slower or less efficiently than a single, monolithic TIM without any such junctions or interfaces.

Alternative embodiments may include a plurality of TIMs and/or multilayered thermal interface materials or structures that form a heat path generally around a battery area. The multilayered thermal interface material or structure may comprise interior heat spreader (e.g., core formed from metal, metal alloy, graphite, sheet of stamped aluminum or copper, etc.) sandwiched between layers of thermal interface material (e.g., phase change material, gap filler, thermal grease, combinations thereof, etc.).

For example, and with further reference to FIG. 15, the TIM 1508 may be configured as multilayered heat spreading thermal interface structure as disclosed in U.S. Pat. No. 7,078,109, the entire disclosure of which is incorporated herein by reference in their entirety. In such embodiment, the TIM 1508 may be configured as a multilayered thermal interface structure that includes a plurality of layers including a core body of high conductivity metal or metal alloy (e.g., copper or aluminum foil sheet, etc.) having opposite sides along which is disposed thermal interface materials (e.g., phase change material, thermal grease, gap filler, combinations thereof, etc.), In an exemplary embodiment, phase change material (e.g., organic, non-metallic, or polymeric phase change material, etc.) may be disposed on one side of the core body, for example, for mounting against the heat source 1504. A soft thermal interface layer (e.g., gap filler material or pad, etc.) may be disposed on the other side of the core body for contacting the exterior casing 1550. The soft thermal interface layer may be configured with a composition which is compressible or deflectable such that when squeezed it will allow for thickness tolerance differences. The soft thermal interface layer may have a thickness substantially greater than the thickness of the layer of phase change material to accommodate variable spacing.

In this example, the TIM 1508 thus includes the bottom or lower portion 1509 formed from a phase change material in contact with the heat source 1504 (e.g., PCB components, etc.). The TIM 1508 also includes the lateral or side portions 1511, 1513 formed from metal or metal alloy that extend upwards from the lower portion 1509 to the top or upper portion 1515 of the TIM 1508. The upper portion 1515 is formed from the soft thermal interface material and is in contact with the casing 1550. Accordingly, heat is transferrable from the heat source 1504 to the phase change material bottom portion 1509, upwards through the metal or metal alloy side portions 1511, 1513, to the soft TIM upper portion 1515, and then to the casing 1550.

A wide variety of materials may be used for any one or more TIMs in embodiments disclosed herein. The TIMs are preferably formed from materials, which preferably are better thermal conductors and have higher thermal conductivities than air alone. Exemplary embodiments include one or more of T-Flex™ 300 series thermal gap filler materials, T-Flex™ 600 series thermal gap filler materials, Tpcm™ 580 series phase change materials, Tpli™ 200 series gap fillers, and/or Tgrease™ 880 series thermal greases from Laird Technologies, Inc. of Saint Louis, Mo., and, accordingly, have been identified by reference to trademarks of Laird Technologies, Inc. Details on these different materials is available at www.lairdtech.com.

As shown in the tables below, T-Flex™ 300 series thermal gap filler materials generally include, e.g., ceramic, filled silicone elastomer which will deflect to over 50% at pressures of 50 pounds per square inch and other properties shown below. T-Flex™ 600 series thermal gap filler materials generally include boron nitride filled silicone elastomer, which recover to over 90% of their original thickness after compression under low pressure (e.g., 10 to 100 pounds per square inch, etc.), have a hardness of 25 Shore 00 or 40 Shore 00 per ASTM D2240, and other properties as shown in table below. Tpli™ 200 series gap fillers generally include reinforced boron nitride filled silicone elastomer, have a hardness of 75 Shore 00 or 70 Shore 00 per ASTM D2240, and other properties as shown in table below. Tpcm™ 580 series phase change materials are generally non-reinforced films having a phase change softening temperature of about 122 degrees Fahrenheit (50 degrees Celsius). Tgrease™ 880 series thermal grease is generally a silicone-based thermal grease having a viscosity of less than 1,500,000 centipoises. Other embodiments may include a TIM with a hardness of less 25 Shore 00, greater than 75 Shore 00, or somewhere therebetween.

By way of further example, other embodiments include a TIM molded from thermally and electrically conductive elastomer. Additional exemplary embodiments include thermally conductive compliant materials or thermally conductive interface materials formed from ceramic particles, metal particles, ferrite EMI/RFI absorbing particles, metal or fiberglass meshes in a base of rubber, gel, grease or wax, etc.

The tables below list various exemplary materials that may be used for a TIM in any one or more embodiments described and/or shown herein. These example materials are commercially available from Laird Technologies, Inc. of Saint Louis, Mo., and, accordingly, have been identified by reference to trademarks of Laird Technologies, Inc. These tables are provided for purposes of illustration only and not for purposes of limitation.

| Name | Construction Composition | Type | Thermal Conductivity [W/mK] | Thermal Impedance [° C.-cm$^2$/W] | Pressure of Thermal Impedance Measurement [kPa] |
|---|---|---|---|---|---|
| T-flex ™ 620 | Reinforced boron nitride filled silicone elastomer | Gap Filler | 3.0 | 2.97 | 69 |
| T-flex ™ 640 | Boron nitride filled silicone elastomer | Gap Filler | 3.0 | 4.0 | 69 |
| T-flex ™ 660 | Boron nitride filled silicone elastomer | Gap Filler | 3.0 | 8.80 | 69 |
| T-flex ™ 680 | Boron nitride filled silicone elastomer | Gap Filler | 3.0 | 7.04 | 69 |

-continued

| Name | Construction Composition | Type | Thermal Conductivity [W/mK] | Thermal Impedance [° C.-cm²/W] | Pressure of Thermal Impedance Measurement [kPa] |
|---|---|---|---|---|---|
| T-flex ™ 6100 | Boron nitride filled silicone elastomer | Gap Filler | 3.0 | 7.94 | 69 |
| T-pli ™ 210 | Boron nitride filled, silicone elastomer, fiberglass reinforced | Gap Filler | 6 | 1.03 | 138 |
| T-pcm ™ 583 | Non-reinforced film | Phase Change | 3.8 | 0.12 | 69 |
| T-flex ™ 320 | Ceramic filled silicone elastomer | Gap Filler | 1.2 | 8.42 | 69 |
| T-grease ™ 880 | Silicone-based based grease | Thermal Grease | 3.1 | 0.138 | 348 |

The tables herein list various thermal interface materials that have thermal conductivities of 1.2, 3, 3.1, 3.8, and 6 W/mK. These thermal conductivities are only examples as other embodiments may include a thermal interface material with a thermal conductivity higher than 6 W/mK, less than 1.2 W/mK, or other value between 1.2 and 6 W/mk. For example, some embodiments may include a thermal interface material that has a thermal conductivity higher than air's thermal conductivity of 0.024 W/mK, such as a thermal conductivity greater than 0.082 W/mK or a thermal conductivity of about 0.5 W/mK or greater.

| PROPERTIES | |
|---|---|
| Color | Grey |
| Density | 2.73 g/cc |
| Viscosity | <1,500,000 cps |
| Brookfield Viscometer | TF spindle at 2 rpm (helipath) and 23° C. |
| Temperature Range | −40-150° C. (−40-302° F.) |
| UL Flammability Rating | 94 V0. File E 180840 |
| Thermal Conductivity | 3.1 W/mK |

| | T-flex ™ 620 | T-flex ™ 640 | T-flex ™ 660 | T-flex ™ 680 | T-flex ™ 6100 | TEST METHOD |
|---|---|---|---|---|---|---|
| Construction & Composition | Reinforced boron nitride filled silicone elastomer | Boron nitride filled silicone elastomer | Boron nitride filled silicone elastomer | Boron nitride filled silicone elastomer | Boron nitride elastomer | |
| Color | Blue-Violet | Blue-Violet | Blue-Violet | Blue-Violet | Blue-Violet | Visual |
| Thickness | 0.020" (0.51 mm) | 0.040" (1.02 mm) | 0.060" (1.52 mm) | 0.080" (2.03 mm) | 0.100" (2.54 mm) | |
| Thickness tolerance | ±0.003" (±0.08 mm) | ±0.004" (±0.10 mm) | ±0.006" (±0.15 mm) | ±0.008" (±0.20 mm) | ±0.010" (±0.25 mm) | |
| Density | 1.38 g/cc | 1.34 g/cc | 1.34 g/cc | 1.34 g/cc | 1.34 g/cc | Helium Pycnometer |
| Hardness | 40 Shore 00 | 25 Shore 00 | 25 Shore 00 | 25 Shore 00 | 25 Shore 00 | ASTM D2240 |
| Tensile Strength | N/A | 15 psi | 15 psi | 15 psi | 15 psi | ASTM D412 |
| % Elongation | N/A | 75 | 75 | 75 | 75 | ASTM D412 |
| Outgassing TML (Post Cured) | 0.13% | 0.13% | 0.13% | 0.13% | 0.13% | ASTM E595 |
| Outgassing CVCM (Post Cured) | 0.05% | 0.05% | 0.05% | 0.05% | 0.05% | ASTM E595 |
| UL Flammability Rating | UL 94 VO | UL 94 VO | UL 94 VO | UL 94 VO | UL 94 VO | E180840 |
| Temperature Range | −45° C. to 200° C. | −45° C. to 200° C. | −45° C. to 200° C. | −45° C. to 200° C. | −45° C. to 200° C. | ASTM D5470 (modified) |
| Thermal Conductivity | 3 W/mK | 3 W/mK | 3 W/mK | 3 W/mK | 3 W/mK | |
| Thermal Impedance | | | | | | |
| @ 10 psi | 0.46° C.-in²/W | 0.62° C.-in²/W | 0.85° C.-in²/W | 1.09° C.-in²/W | 1.23° C.-in²/W | ASTM D5470 |
| @ 69 KPa | 2.97° C.-cm²/W | 4.00° C.-cm²/W | 5.50° C.-cm²/W | 7.04° C.-cm²/W | 7.94° C.-cm²/W | (modified) |
| Thermal Expansion | 600 ppm/° C. | 430 ppm/° C. | 430 ppm/° C. | 430 ppm/° C. | 430 ppm/° C. | IPC-TM-650 2.4.24 |
| Breakdown Voltage | 3,000 volts AC | >5,000 Volts AC | >5,000 Volts AC | >5,000 Volts AC | >5,000 Volts AC | ASTM D149 |
| Volume Resistivity | $2 \times 10^{13}$ ohm-cm | $2 \times 10^{13}$ ohm-cm | $2 \times 10^{13}$ ohm-cm | $2 \times 10^{13}$ ohm-cm | $2 \times 10^{13}$ ohm-cm | ASTM D257 |
| Dielectric Constant @ 1 MHz | 3.31 | 3.31 | 3.51 | 3.31 | 3.31 | ASTM D150 |

-continued

| PROPERTIES | |
|---|---|
| Thermal Resistance | |
| @ 10 psi | 0.014° C.-in$^2$/W (0.090° C.-cm$^2$/W) |
| @ 20 Psi | 0.010° C.-in$^2$/W (0.065° C.-cm$^2$/W) |
| @ 50 psi | 0.009° C.-in$^2$/W (0.058° C.-cm$^2$/W) |
| Volume Resistivity (ASTM D257) | 9 × 10$^{13}$ Ohm-cm |

Specifications

TFLEX™ 300 Typical Properties

| | TFLEX ™ 300 | TEST METHOD |
|---|---|---|
| Construction | Filled silicone elastomer | NA |
| Color | Light green | Visual |
| Thermal Conductivity | 1.2 W/mK | ASTM D5470 |

| PROPERTIES | Tpcm ™ 583 | Tpcm ™ 585 | Tpcm ™ 588 | Tpcm ™ 5810 |
|---|---|---|---|---|
| Construction & composition | Non-reinforced film | | | |
| Color | Gray | | | |
| Thickness | 0.003" (0.076 mm) | 0.005" (0.127 mm) | 0.008" (0.2 mm) | 0.010" (0.25 mm) |
| Density | colspan 2.87 g/cc | | | |
| Operating temperature range | −40° C. to 125° C. (−40° C. to 257° F.) | | | |
| Phase change softening temperature | colspan 50° C. (122° F.) | | | |
| Thermal resistance | | | | |
| 10 psi | 0.019° C.-in$^2$/W (0.12° C.-cm$^2$/W) | 0.020° C.-in$^2$/W (0.13° C.-cm$^2$/W) | 0.020° C.-in$^2$/W (0.13° C.-cm$^2$/W) | 0.020° C.-in$^2$/W (0.13° C.-cm$^2$/W) |
| 20 psi | 0.016° C.-in$^2$/W (0.10° C.-cm$^2$/W) | 0.016° C.-in$^2$/W (0.10° C.-cm$^2$/W) | 0.016° C.-in$^2$/W (0.10° C.-in$^2$/W) | 0.016° C.-in$^2$/W (0.010° C.-cm$^2$/W) |
| 50 psi | 0.013° C.-in$^2$/W (0.08° C.-cm$^2$/W) | 0.013° C.-in$^2$/W (0.08° C.-cm$^2$/W) | 0.013° C.-in$^2$/W ((0.08° C.-cm$^2$/W) | 0.013° C.-in$^2$/W (0.08° C.-cm$^2$/W) |
| Thermal conductivity | colspan 3.8 W/mK | | | |
| Volume resistivity | colspan 3.0 × 10$^{12}$ ohm-cm | | | |

| | TFLI ™ 210 | TPLI ™ 220 | TPLI ™ 240 | TPLI ™ 260 | TPLI ™ 2100 | TEST METHOD |
|---|---|---|---|---|---|---|
| Construction & Composition | Reinforced boron nitride filled silicone elastomer | Boron nitride filled silicone elastomer | Boron nitride filled silicone elastomer | Boron nitride filled silicone elastomer | Boron nitride filled silicone elastomer | |
| Color | Rose | Blue | Yellow | Grey | Grey | Visual |
| Thickness | 0.010" (0.25 mm) | 0.020" (0.51 mm) | 0.040" (1.02 mm) | 0.060" (1.52 mm) | 0.100" (2.54 mm) | |
| Thickness Tolerance | ±0.001" (±0.025 mm) | ±0.002" (±0.05 mm) | ±0.003" (±0.08 mm) | ±0.004" (±0.10 mm) | ±0.007" (±0.18 mm) | |
| Density | 1.44 g/cc | 1.43 g/cc | 1.43 g/cc | 1.38 g/cc | 1.36 g/cc | Helium Pycnometer |
| Hardness | 75 Shore OO | 70 Shore OO | 70 Shore OO | 70 Shore OO | 70 Shore OO | ASTM D2240 |
| Tensile Strength | N/A | 35 psi | 35 psi | 20 psi | 15 psi | ASTM D412 |
| % Elongation | N/A | 5 | 5 | 5 | 5 | ASTM D412 |
| Outgassing TML (Post Cured) | 0.08% | 0.07% | 0.07% | 0.10% | 0.15% | ASTM E595 |
| Outgassing CVCM (Post Cured) | 0.03% | 0.02% | 0.02% | 0.04% | 0.07% | ASTM E595 |
| UL Flammability Rating | 94 HB | 94 HB | 94 HB | 94 HB | 94 HB | E180840 |
| Temperature Range | −45° C. to 200° C. | −45° C. to 200° C. | −45° C. to 200° C. | −45° C. to 200° C. | −45° C. to 200° C. | |
| Thermal Conductivity | 6 W/mK | 6 W/mK | 6 W/mK | 6 W/mK | 6 W/mK | ASTM D5470 (modified) |
| Thermal impedance | | | | | | |
| @ 20 psi @ 138 KPa | 0.16° C.-in$^2$/W 1.03° C.-cm$^2$/W | 0.21° C.-in$^2$/W 1.35° C.-cm$^2$/W | 0.37° C.-in$^2$/W 2.45° C.-cm$^2$/W | 0.49° C.-in$^2$/W 3.35° C.-cm$^2$/W | 0.84° C.-in$^2$/W 5.81° C.-cm$^2$/W | ASTM D5470 (modified) |
| Thermal Expansion | 51 ppm/C. | 123 ppm/C. | 72 ppm/C. | 72 ppm/C. | 96 ppm/C. | IPC-TM-650 2.4.24 |
| Breakdown voltage | 1,000 Volts AC | 4,000 Volts AC | >5,000 Volts AC | >5,000 Volts AC | >5,000 Volts AC | ASTM D149 |
| Volume Resisitivity | 5 × 10$^{13}$ ohm-cm | 5 × 10$^{13}$ ohm-cm | 5 × 10$^{13}$ ohm-cm | 5 × 10$^{13}$ ohm-cm | 5 × 10$^{13}$ ohm-cm | ASTM D257 |
| Dielectric Constant @ 1 MHz | 3.21 | 3.21 | 3.26 | 3.26 | 3.4 | ASTM D150 |

-continued

|  | TFLEX ™ 300 | TEST METHOD |
|---|---|---|
| Hardness (Shore 00) | 27 (at 3 second delay) | ASTM D2240 |
| Density | 1.78 g/cc | Helium Pyncometer |
| Thickness Range | 0.020"-.200" (0.5-5.0 mm)* |  |
| Thickness Tolerance | ±10% |  |
| UL Flammability Rating | 94 V0 | UL |
| Temperature Range | −40° C. to 160° C. | NA |
| Volume Resistivity | 10^13 ohm-cm | ASTM D257 |
| Outgassing TML | 0.56% | ASTM E595 |
| Outgassing CVCM | 0.10% | ASTM E595 |
| Coefficient Thermal Expansion (CTE) | 660 ppm/C | IPC-TM-650 2.4.24 |

In addition to the examples listed in the tables above, other thermally-conductive compliant materials or thermally-conductive interface materials can also be used for a TIM, which are preferably better than air alone at conducting and transferring heat. For example, a TIM may include compressed particles of exfoliated graphite, formed from intercalating and exfoliating graphite flakes, such as eGraf™ commercially available from Advanced Energy Technology Inc. of Lakewood, Ohio. Such intercalating and exfoliating graphite may be processed to form a flexible graphite sheet, which may include an adhesive layer thereon. Any of the TIMs disclosed herein (e.g., 108, 140, 408, 820, etc.) may comprise one or more of the thermal interface materials (e.g., graphite, flexible graphite sheet, exfoliated graphite, etc.) disclosed in U.S. Pat. Nos. 6,482,520, 6,503,626, 6,841,250, 7,138,029, 7,150,914, 7,160,619, 7,267,273, 7,303,820, U.S. Patent Application Publication 2007/0042188, and/or U.S. Patent Application Publication 2007/0077434.

In various exemplary embodiments, a TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. In exemplary embodiments, the TIM may be configured to have sufficient conformability, compliability, and/or softness to allow the TIM material to closely conform to a mating surface when placed in contact with the mating surface, including a non-flat, curved, or uneven mating surface. By way of example, some exemplary embodiments include an electrically conductive soft thermal interface material formed from elastomer and at least one thermally-conductive metal, boron nitride, and/or ceramic filler, such that the soft thermal interface material is conformable even without undergoing a phase change or reflow. Yet other embodiments include thermal interface phase change material, such as the T-Pcm™ 583 listed in the above table.

In some embodiments, one or more conformable thermal interface material gap filler pads are used having sufficient deformability, compliance, conformability, compressibility, and/or flexibility for allowing a pad to relatively closely conform to the size and outer shape of an electronic component when placed in contact with the electronic component when the shielding apparatus is installed to a printed circuit board over the electronic component. By engaging an electronic component in a relatively close fitting and encapsulating manner, a conformable thermal interface material gap pad may conduct heat away from the electronic component to the cover in dissipating thermal energy. Also, the thermal interface material gap filler pad may be a non-phase change material and/or be configured to adjust for tolerance or gap by deflecting. Such a thermal interface material gap filler pad would not be considered to be a spreadable paste.

The following examples, computational modeling, and computational fluid dynamics (CFD) results shown in FIGS. 9, 10, and 11 are merely illustrative, and do not limit this disclosure in any way. For this example, three computations models were created in order to better understand the heat transfer to a device's casing when there is thermally-conductive heat path around a battery and/or battery area of the electronic device. For each of the three computational models, it was assumed that the device casing had a thickness of about 0.625 millimeters and a thermal conductivity (k) of 0.14 Watts per meter per Kelvin.

FIG. 9 illustrates CFD results showing external temperatures (in degrees Celsius) of an external casing of an electronic device, in which the computational model included a thermally-conductive heat path through a BLS around the battery area (and battery therein) in accordance with exemplary embodiments, such as assembly 100 shown in FIG. 1. Generally, FIG. 9 shows that the maximum casing temperature reached 72.7 degrees Celsius when the BLS was disposed about or defined the battery area.

FIG. 10 illustrates CFD results showing external temperatures (in degrees Celsius) of an external casing of an electronic device, in which the computational model included a thermally-conductive heat path through a TIM around the battery area (and battery therein) in accordance with exemplary embodiments, such as the assembly 300 shown in FIG. 3. Generally, FIG. 10 shows that the maximum casing temperature reached 71.7 degrees Celsius when the TIM was disposed about or defined the battery area.

FIG. 11 illustrates CFD results showing external temperatures in degrees Celsius of an external casing of an electronic device, in which the computational model did not include a thermally-conductive heat around the battery area (and battery therein), e.g., battery area 1230 in FIG. 12. For the computational model used to obtain the CFD results shown in FIG. 11, it was assumed that the underside of the shield 1210 (FIG. 12) was spaced apart from and positioned 10 mils above the top surface of the components 1204 on the PCB 1202. It was also assumed that there was not any thermal interface material between the shield 1210 and the components 1204 or between the shield 1210 and the casing 1250. Generally, FIG. 11 shows that the maximum casing temperature reached 83.9 degrees Celsius when there was no TIM or BLS disposed about or defined the battery area (which was higher than the maximum casing temperatures of 72.7 degrees Celsius shown in FIG. 9 and 71.7 degrees Celsius shown in FIG. 10.

In any one or more of the various embodiments disclosed herein, the shield may comprise a frame and a cover attachable to the frame. For example, the cover may include detents for securing the cover to a frame that is mounted on the circuit board, to provide a compressive force when the cover is secured in place over the one or more heat generating components. The cover may be pressed vertically downward onto the frame such that at least one locking snap engages and locks into a corresponding opening to thereby engage the cover to the frame. In some embodiments, the cover includes the locking snaps or catches (e.g., latches, tabs, detents, protuberances, protrusions, ribs, ridges, ramp-ups, darts, lances, dimples, half-dimples, combinations thereof, etc.) with the frame including the corresponding openings (e.g., recesses, voids, cavities, slots, grooves, holes, depressions, combinations thereof, etc.). In other embodiments, the frame includes the locking snaps or catches, and the cover includes the corresponding openings. In still further embodiments, the cover and frame may both include locking snaps or catches for engaging corresponding openings of the other component.

By way of example only, FIG. 13 illustrates an exemplary two-piece shield 1300, which may be used in one or more embodiments disclosed herein. As shown, the shield 1300 includes a frame 1302 and a cover 1310. The frame 1302 includes openings 1303. The cover 1310 includes detents, protrusions or protuberances 1328 configured to be engagingly received (e.g., interlocked or snapped into, etc.) in the corresponding openings 1303 of the frame 1302. The detents 1328 of the cover 1310 may thus be engaged with the corresponding openings 1303 of the frame 1302, to thereby attach the cover 1310 to the frame 1302 in a latched position. In the latched position, a mechanical or clamping force may be generated that biases the cover 1310 downwardly towards the frame 1302. This biasing force can help provide relatively low thermal impedance by causing a thermal interface material (e.g., TIM 308 in FIG. 3, TIM 508 in FIG. 6, etc.) disposed on the underside of the cover 1310 to compressively contact against at least a portion of an electronic component (e.g., component 304 FIG. 3, component 504 in FIG. 6, etc.).

Further aspects relate to methods of using EMI shields, TIMs, and assemblies thereof. In one exemplary embodiment, a method is disclosed for providing heat dissipation from one or more heat generating components of a board having an EMI shielding and thermal management assembly that includes a thermally-conductive compliant material disposed between the one or more heat generating components and an EMI shielding cover, and a thermally-conductive structure defining two or more side portions extending upwardly from the topside of the EMI shielding cover, and at least one laterally extending portion that is in contact with the two or more sidewall portions, to define an area or compartment in which may be received at least a portion of a battery. The method includes contacting one or more heat generating components with a thermally-conductive compliant material. The method further includes establishing a thermally-conductive path in contact with the thermally-conductive compliant material, for conducting heat away from the underside of the EMI shielding cover and around the area or compartment via the two or more side portions and the one or more laterally extending portions to a casing. The method further provides for dissipating heat generated by the one or more heat generating components through the thermally-conductive path, to thereby dissipate heat from the one or more heat generating components under the EMI shielding cover through the one or more laterally extending portions above the area or compartment to a casing.

Additional aspects of the present disclosure include methods relating to heat dissipation with thermally-conductive heat paths within electronic devices. In an exemplary embodiment, a method generally includes positioning one or more portions of at least one of an electromagnetic interference (EMI) shield and a thermal interface material relative to the electronic device, so as to establish a portion of a thermally-conductive heat path generally around a battery area between an exterior casing and a circuit board of the electronic device. The thermally-conductive heat path may allow heat transfer from one or more heat generating components on the circuit board within the electronic device to the exterior casing.

Other aspects of the present disclosure include methods relating to the operation of electronic devices, such as an electronic device that includes an exterior casing, a circuit board having one or more heat generating components, and a battery area generally between the circuit board and the exterior casing. In an exemplary embodiment, a method generally includes allowing heat transfer from the one or more heat generating components to the exterior casing, along a thermally-conductive heat path and a portion thereof generally around the battery area that is defined by one or more portions of at least one of an electromagnetic interference (EMI) shield and a thermal interface material.

Exemplary embodiments (e.g., 100, 300, 400, 500, 600, 800, 1400, etc.) disclosed herein may be used with a wide range of electronic components, EMI sources, heat-generating components, heat sinks, among others. By way of example only, exemplary applications include printed circuit boards, high frequency microprocessors, central processing units, graphics processing units, laptop computers, notebook computers, desktop personal computers, computer servers, thermal test stands, portable communications terminals (e.g., cellular phones, etc.), etc. Accordingly, aspects of the present disclosure should not be limited to use with any one specific type of end use, electronic component, part, device, equipment, etc.

Numerical dimensions and the specific materials disclosed herein are provided for illustrative purposes only. The particular dimensions and specific materials disclosed herein are not intended to limit the scope of the present disclosure, as other embodiments may be sized differently, shaped differently, and/or be formed from different materials and/or processes depending, for example, on the particular application and intended end use.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter. The disclosure of a first value and a second value for a given parameter can be interpreted as disclosing that any value between the first and second values could also be employed for the given parameter. Similarly, it is envisioned that disclosure of two or more ranges of values for a parameter (whether such ranges are nested, overlapping or distinct) subsume all possible combination of ranges for the value that might be claimed using endpoints of the disclosed ranges.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. An assembly suitable for use in dissipating heat from one or more heat generating components of a circuit board within an electronic device that includes an exterior casing and a battery area between the circuit board and the exterior casing, the assembly comprising a thermally-conductive structure which comprises elastomer and is disposed about or defining the battery area such that a thermally-conductive heat path is provided from the one or more heat generating components around the battery area to the exterior casing, the thermally-conductive heat path including a portion around a battery positioned within the battery area provided by the thermally-conductive structure, such that heat is transferrable through the thermally-conductive structure and along the thermally-conductive heat path from the one or more heat generating components around the battery area to the exterior casing.

2. The assembly of claim 1, wherein the elastomer is filled with thermally-conductive materials formed from at least one thermally-conductive metal, boron nitride, ceramic filler, and/or particles of intercalated and exfoliated graphite flakes.

3. The assembly of claim 1, wherein the thermally conductive structure comprises a core body of high conductivity metal or metal alloy having opposite sides along which is disposed thermal interface material for mounting against the exterior casing and for mounting against the one or more heat generating components, the thermal interface material including one or more of phase change material, thermal grease, and/or gap filler.

4. The assembly of claim 1, wherein the thermally conductive structure has a Shore 00 hardness of from about 25 to about 75.

5. The assembly of claim 1, wherein the thermally conductive structure comprises:
   a thermal interface material gap filler including boron nitride filled silicone elastomer having a Shore 00 hardness of from about 25 to about 75 and/or configured to recover to over 90% of its original thickness after compression under low pressure of 10 to 100 pounds per square inch; and/or
   a thermal interface material gap filler including silicone elastomer filled with thermally-conductive materials and having a Shore 00 hardness of about 27 and/or configured to deflect to over 50% of its original thickness at a pressure of 50 pounds per square inch; and/or
   non-reinforced phase change material having a phase change softening temperature of 122 degrees Fahrenheit; and/or
   a silicone-based thermal grease having a viscosity of less than 1,500,000 centipoises.

6. The assembly of claim 1, wherein the thermally conductive structure is configured with sufficient conformability to allow the thermally conductive structure to closely conform to a mating surface when placed in contact with the mating surface, including a non-flat, curved, or uneven mating surface.

7. The assembly of claim 1, wherein the thermally-conductive structure is wrapped about the battery for the electronic device.

8. The assembly of claim 1, wherein the thermally conductive structure comprises thermally and electrically conductive elastomer.

9. The assembly of claim 1, further comprising an electromagnetic interface (EMI) shield configured to be disposed over the one or more heat generating components to provide EMI shielding to the one or more heat generating components.

10. The assembly of claim 9, wherein the thermally conductive structure includes:
   a first thermal interface material between the EMI shield and the one or more heat generating components such that an air gap separates the EMI shield from the first thermal interface material, which is in contact with the one or more heat generating components; and
   a second thermal interface material in contact with the exterior casing and the first thermal interface material such that heat is transferrable through the first and second thermal interface materials along the thermally-conductive heat path from the one or more heat generating components around the battery area to the exterior casing.

11. An electronic device comprising:
- a circuit board including one or more heat generating components;
- an exterior casing;
- a battery area between the circuit board and the exterior casing;
- an electromagnetic interference (EMI) shielding/thermal interface material positioned relative to the one or more heat generating components to provide EMI shielding to the one or more heat generating components; and
- a thermally-conductive heat path at least partially defined by the EMI shielding/thermal interface material from the one or more heat generating components to the exterior casing, the thermally-conductive heat path including a portion around the battery area that is defined by one or more portions of the EMI shielding/thermal interface material, such that heat is transferrable through the EMI shielding/thermal interface material and along the thermally-conductive heat path from the one or more heat generating components around the battery area to the exterior casing.

12. The electronic device of claim 11, wherein the EMI shielding/thermal interface material comprises thermally and electrically conductive elastomer.

13. The electronic device of claim 11, further comprising a battery within the battery area about which is wrapped at least a portion of the EMI shielding/thermal interface material, such that the at least one wrapped portion of the EMI shielding/thermal interface material defines the portion of the thermally-conductive heat path around the battery area.

14. The electronic device of claim 11, wherein the EMI shielding/thermal interface material comprises elastomer filled with thermally-conductive materials formed from at least one thermally-conductive metal, boron nitride, ceramic filler, and/or particles of intercalated and exfoliated graphite flakes.

15. The electronic device of claim 11, wherein the EMI shielding/thermal interface material has a Shore 00 hardness of from about 25 to about 75.

16. The electronic device of claim 11, wherein the EMI shielding/thermal interface material comprises a core body of high conductivity metal or metal alloy having opposite sides along which is disposed thermal interface material for mounting against the exterior casing and for mounting against the one or more heat generating components, the thermal interface material including one or more of phase change material, thermal grease, and/or gap filler.

17. The electronic device of claim 11, wherein the EMI shielding/thermal interface material comprises:
- a thermal interface material gap filler including boron nitride filled silicone elastomer having a Shore 00 hardness of from about 25 to about 75 and/or configured to recover to over 90% of its original thickness after compression under low pressure of 10 to 100 pounds per square inch; and/or
- a thermal interface material gap filler including silicone elastomer filled with thermally-conductive materials and having a Shore 00 hardness of about 27 and/or configured to deflect to over 50% of its original thickness at a pressure of 50 pounds per square inch; and/or
- non-reinforced phase change material having a phase change softening temperature of 122 degrees Fahrenheit; and/or
- a silicone-based thermal grease having a viscosity of less than 1,500,000 centipoises.

18. The electronic device of claim 11, wherein the EMI shielding/thermal interface material is configured with sufficient conformability to allow the thermally conductive structure to closely conform to a mating surface when placed in contact with the mating surface, including a non-flat, curved, or uneven mating surface.

19. The electronic device of claim 11, further comprising an electromagnetic interface (EMI) shield disposed over the one or more heat generating components to provide EMI shielding to the one or more heat generating components.

20. The electronic device of claim 19, wherein the EMI shielding/thermal interface material comprises:
- a first thermal interface material between the EMI shield and the one or more heat generating components such that an air gap separates the EMI shield from the first thermal interface material, which is in contact with the one or more heat generating components; and
- a second thermal interface material in contact with the exterior casing and the first thermal interface material such that heat is transferrable through the first and second thermal interface materials along the thermally-conductive heat path from the one or more heat generating components around the battery area to the exterior casing.

21. A method relating to heat dissipation with a thermally-conductive heat path within an electronic device for allowing heat transfer from one or more heat generating components on a circuit board within the electronic device to an exterior casing of the electronic device, the method comprising positioning a thermally-conductive structure which comprises elastomer to establish a thermally-conductive heat path around a battery area for receiving a battery for the electronic device between the exterior casing and the circuit board of the electronic device, such that heat may be transferred through the thermally-conductive structure which comprises elastomer and along the thermally-conductive heat path from the one or more heat generating components around the battery area to the exterior casing.

22. The method of claim 21, wherein the positioning includes wrapping the thermally conductive structure which comprises elastomer around the battery for the electronic device.

23. The method of claim 22, further comprising inserting the battery into the battery area of the electronic device after the wrapping.

24. The method of claim 21, wherein the thermally conductive structure comprises a core body of high conductivity metal or metal alloy having opposite sides along which is disposed thermal interface material for mounting against the exterior casing and for mounting against the one or more heat generating components, the thermal interface material including one or more of phase change material, thermal grease, and/or gap filler.

* * * * *